United States Patent [19]
Nishizawa et al.

[11] Patent Number: 4,603,420
[45] Date of Patent: Jul. 29, 1986

[54] OPTICAL INTEGRATED CIRCUIT

[75] Inventors: Junichi Nishizawa; Tadahiro Ohmi; Masakazu Morishita, all of Miyagi, Japan

[73] Assignee: Handotai Kenkyo Shinkokai, Miyagi, Japan

[21] Appl. No.: 510,099

[22] Filed: Jul. 1, 1983

[30] Foreign Application Priority Data

Jul. 1, 1982 [JP] Japan ................... 57-114871

[51] Int. Cl.⁴ .............................. H01S 3/19
[52] U.S. Cl. ........................ 372/45; 357/17; 372/46; 372/48; 372/49; 372/50
[58] Field of Search ............... 372/44, 45, 46, 48, 372/49, 50; 357/16, 17

[56] References Cited

U.S. PATENT DOCUMENTS

| | | | |
|---|---|---|---|
| 4,100,508 | 7/1978 | Wittke | 372/49 |
| 4,278,949 | 7/1981 | Marshall et al. | 372/46 |
| 4,360,919 | 11/1982 | Fujiwara et al. | 372/46 |
| 4,512,022 | 4/1985 | Tsang | 372/45 |

FOREIGN PATENT DOCUMENTS 0125692 9/1980 Japan ..................... 372/48

OTHER PUBLICATIONS

Lin et al., "CW and High-Speed Single-Longitudinal-Mode Operation of a Short InGaAsP Injection Laser with External Coupled Cavity", post deadline paper No. PD5-1, Topical Meeting on Optical Fiber Communication, New Orleans, Feb. 28-Mar. 2, 1983.

Primary Examiner—James W. Davie
Attorney, Agent, or Firm—Sughrue, Mion, Zinn, Macpeak & Seas

[57] ABSTRACT

A semiconductor laser suitable for incorporation into integrated circuits by providing the laser device with a short resonator dimensioned so as to restrict the power consumption of the device to about 1 mW or less. This is made possible by improving the optical confinement, carrier confinement and the reflectivity of end faces in the lasing cavity with a short length and a narrow stripe width of the cavity. Double-layered mirrors are formed at the two opposed ends of the resonator by depositing a film of dielectric insulating material directly on each end and covering the film with a layer of metal.

40 Claims, 63 Drawing Figures

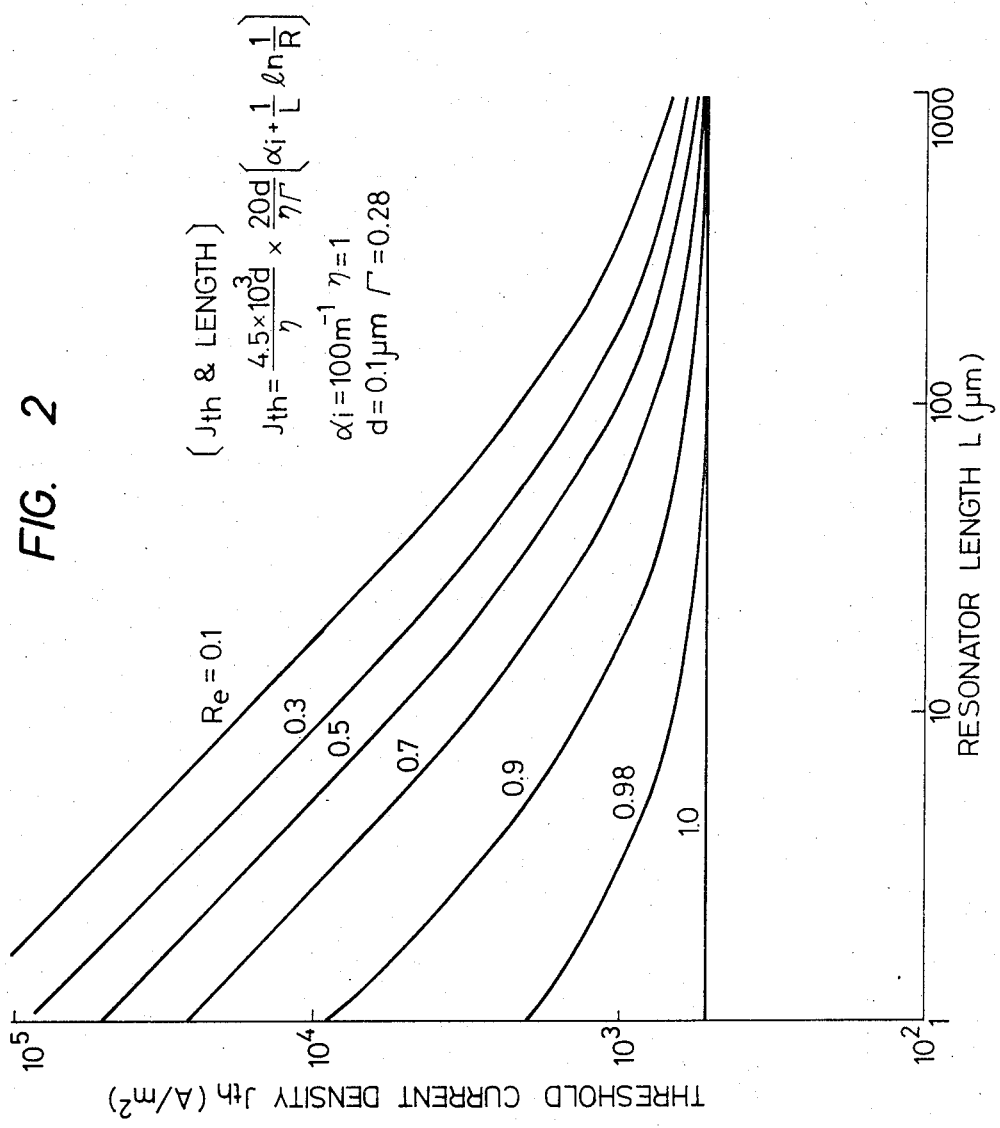

OPTICAL INTEGRATED CIRCUIT

BACKGROUND OF THE INVENTION

The present invention relates to a semiconductor laser having a short resonator length and to an optical integrated circuit including at least one semiconductor laser of such type.

A conventional semiconductor laser fabricated as a discrete device usually has a length and a width of about 200 μm to 400 μm and a current path stripe width of about 2 μm to 13 μm. Due to this bulky structure, and its corresponding large power consumption, the conventional semiconductor laser is not suitable for use in an integrated circuit. Even if it were so used, it would be impossible to obtain as high an integration density as that obtainable in a conventional integrated circuit. An optical integrated circuit is generally considered impractical unless the integration density and the power consumption thereof are at least at about the same levels as those of a conventional integrated circuit.

SUMMARY OF THE INVENTION

An object of the present invention is to provide a laser device which has a short optical cavity length and narrow stripe width, and an optical integrated circuit including at least one laser of such type.

The above, as well as other objects of the invention, are met by a double-heterojunction type semiconductor laser having a short optical resonator length. The dimensions of the resonator are set so as to restrict the power consumption of the laser device to about 1 mW or less. This is made possible by improving the optical confinement, carrier confinement and reflectivity of end faces in the lasing cavity with short length and narrow stripe width. In this invention, many kinds of structure are applied to the semiconductor laser. Mirrors are formed at the two opposed ends of the optical cavity by depositing a thin dielectric insulating film directly over the ends of the optical cavity and covering this film with a layer of metal.

BRIEF DESCRIPTION OF THE DRAWINGS

FIGS. 2 through 10 are graphs which are used to explain the structure of a resonator and the characteristics of the semiconductor laser;

DESCRIPTION OF THE PREFERRED EMBODIMENTS

Figure 1:
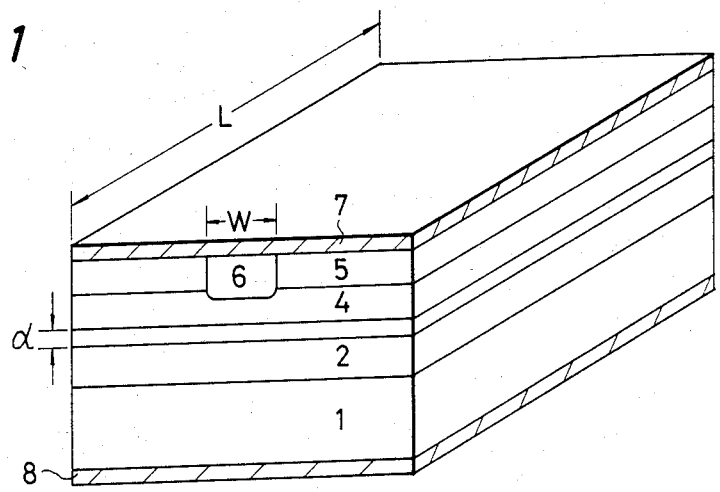
FIG. 1 is a perspective view of a typical semiconductor laser.

FIG. 1 shows in perspective view a typical structure of a conventional semiconductor laser which has, for example, a double-heterojunction (DH) structure of GaAs and $Ga_{1-x}Al_xAs$. In FIG. 1, the laser includes an $n^+$-type GaAs substrate 1, an $n^+$-type $Ga_{1-x}Al_xAs$ region 2, a GaAs portion (active region) 3, a $p^+$-type $Ga_{1-x}Al_xAs$ region 4, an n-type GaAs region 5, a $p^+$-type diffusion region 6 and electrodes 7 and 8. The diffusion stripe width, the active layer thickness and the length of a resonator formed between opposite ends of the laser are depicted by reference characters W, d and L, respectively.

In attempting to make the resonator shorter, the most important problem encountered is typically an increase of the threshold current density. That is, in a semiconductor laser, the power reflection coefficient R of each end face thereof is considerably smaller than unity ($R \approx 0.31$ for GaAs and $R \approx 0.29$ for InP), although the exact value of R depends upon the thickness of the active layer, the material around both side portions (cladding layers) of the active layer and the oscillation mode. Therefore, in the short resonator semiconductor laser, the mirror losses at the end faces are considerably larger compared with internal the losses in the optical resonator. For a double-hetero structure laser of a GaAlAs-GaAs system, for example, the threshold current density can be represented as follows:

$$J_{th}(A/cm^2) = \frac{4.5 \times 10^3 d}{\eta} + \frac{20d}{\eta \Gamma} \times \left[ \alpha_i + \frac{1}{L} \ln \sqrt{\frac{1}{R_1 R_2}} \right] \quad (1)$$

where $\eta$ is internal the quantum efficiency of carriers, d is the thickness (μm) of the active layer, $\Gamma$ represents the light confinement coefficient, $\alpha_i$ corresponds to the internal loss ($cm^{-1}$), L is the length (cm) of the resonator, and $R_1$ and $R_2$ indicate the power reflectivities at the end faces. If the resonator length L is large, the first term on the right-hand side of equation (1) is relatively large and, if L is small, the mirror loss $$\left(\frac{1}{L}\ln\left(\frac{1}{\sqrt{R_1 R_2}}\right)\right)$$

becomes large.

FIG. 2 shows the relationship between the resonator length L and the threshold current density $J_{th}$ for a GaAs-GaAlAs double-hetero laser, the relevant conditions of which are $d=0.1$ μm, $\alpha_i = 10$ cm$^{-1}$, $\Gamma = 0.28$ and $\Gamma = 1$, with the reflection coefficient $R_1 = R_2$ varying in a range of 0.1 to 1 as parameter. As a is clear from FIG. 2, when the resonator length L is large, the threshold current density is small, even if the reflection coefficient $R_1$ or $R_2$ is small. In this case, it can be seen that the thickness d of the active layer has the greatest effect on the threshold density. However, when the length of the resonator is small, $J_{th}$ became very large. Therefore, if the resonator length is to be shortened, it is necessary to make the reflection coefficient R large to restrict the threshold current density.

When the injection current density is very large, the semiconductor element may be seriously degraded due to local heat generation, etc., resulting in a shortened life and unreliability of the device. Therefore, it is necessary to make the current density during operation as low as possible. For example, if a current density of $10^4 \text{A/cm}^2$ or more is to be employed, a voltage considerably larger than the voltage difference determined by the band gap should be applied resulting in a large local power consumption. In the regions 1 and 6 in FIG. 1, the carrier density can be increased up to about $1 \times 10^{19}$ cm$^{-3}$ for GaAs. However, the Ga$_{1-x}$Al$_x$As$_x$, particularly when $x > 0.25$, it is impossible to increase the carrier density to a sufficiently high value due to a large ionization energy. The realizable density may be only $5 \times 10^{17}$ to $1 \times 10^{18}$ cm$^{-3}$ at most at room temperature.

Further, in the double-hetero structure, n-type regions of the cladding layers (2 and 4, etc. in FIG. 1) sandwiching the active layer 3 may be injected only with electrons and the p-type regions of the cladding layers 2 and 4 may be injected only with holes due to barriers formed in the heterojunctions. Therefore, if it were attempted to inject carriers at a density higher than that of the cladding layers to these regions, the respective cladding layers would act as if they were intrinsic layers. Consequently, external voltages have to be applied across the active layer 3, across the p+p interface between the layers 4 and 6, and across the n+n interface between the layers 1 and 2, resulting in diffusion currents in the cladding layers 2 and 4. With a further increase in the injected current, drift carriers may be created in the cladding layers, and hence a space charge may be formed, thereby making it necessary to apply a high voltage in order to cause current to flow. Thus, the current v. voltage characteristic of the device may not be an exponential function.

A carrier injection density of $5 \times 10^{17}$ cm$^{-3}$ corresponds to a current density J which is nearly equal to 800 A/cm$^2$, where the thickness d of the active layer and the mean carrier lifetime $\tau_s$ are 0.1 μm and $1 \times 10^{-9}$ sec, respectively. For a current larger than the above, voltage drops may occur across portions other than the pn junction, causing the voltage applied across the device, and thus the power consumption thereof, to be increased as mentioned previously. As shown in FIG. 2, with a shorter resonator, the threshold current density increases up to a value exceeding 800 A/cm$^2$. For example, with a resonator having a length L of 10 μm and a reflection coefficient R of 0.7 at the end faces, the threshold current density $J_{th}$ becomes 3000 A/cm$^2$. Thus, with such a short resonator, the reflection coefficient at the end faces should be large, otherwise $J_{th}$ will be too large, as will be clear from FIG. 2.

Figure 3:
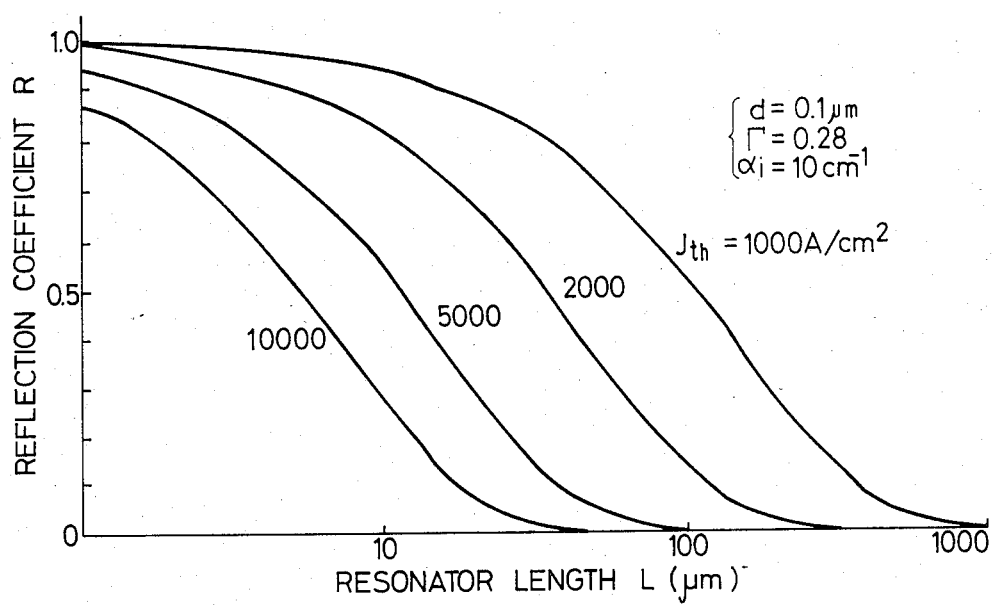

FIG. 3 shows the relationship between the length L of the resonator and the effective optical power reflection coefficient $\sqrt{R_1 R_2}$ at the opposite end faces of the resonator with the threshold current as a parameter. In FIG. 3, the thickness d of the active layer set at 0.1 μm, and with $J_{th} = 2000$ A/cm$^2$ and L = 10 μm, the reflection coefficient R is 0.81 and, with $J_{th} = 5000$ A/cm$^2$ and L = 10 μm, the reflection coefficient $R_1$ and $R_2$ becomes nearly equal to 0.44. It is clear that, in order to make $J_{th}$ small, R should be made large.

Figure 4:
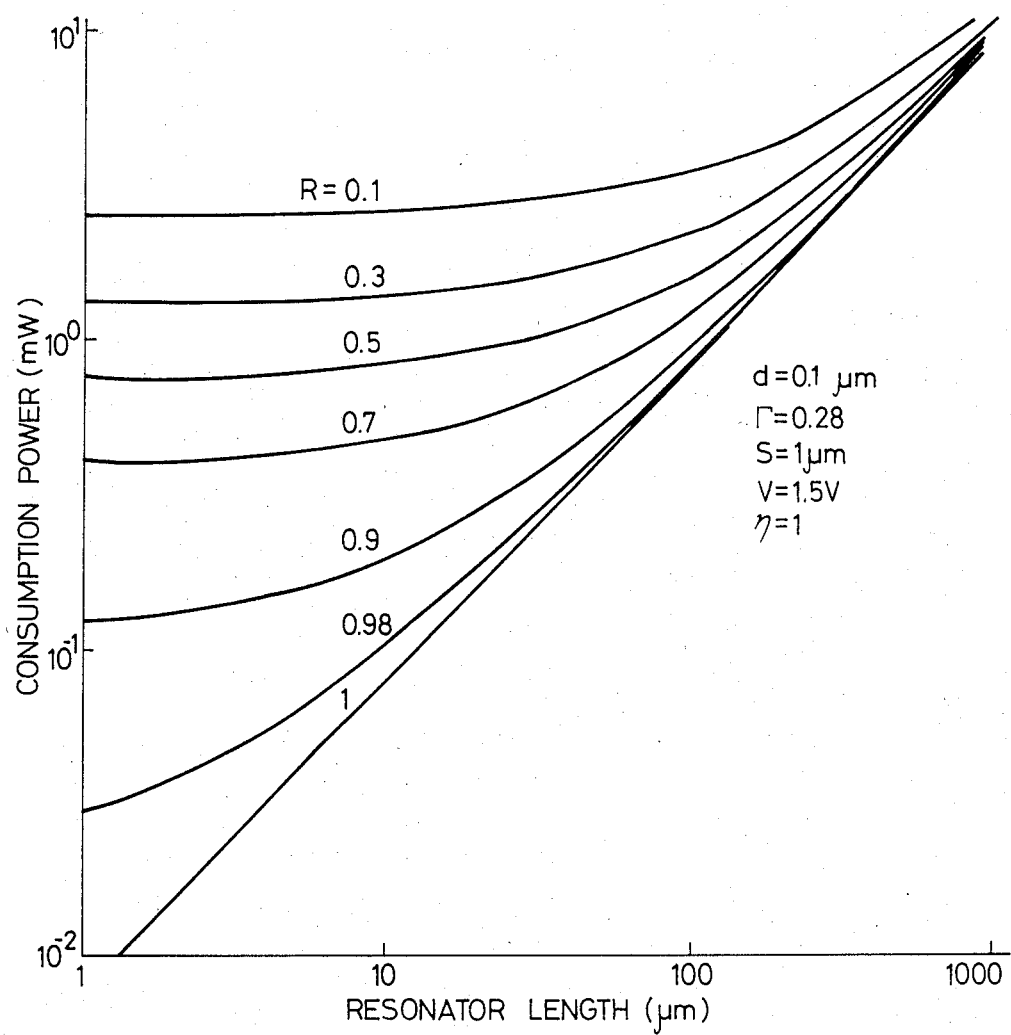

FIG. 4 is a graph of the power P (mW) consumed in a semiconductor laser versus the length L (μm) of the resonator with the effective reflection coefficient $\sqrt{R_1 R_2}$ as a parameter. In the example, the stripe width is 1 μm and a constant voltage of 1.5 V is applied thereacross. The effect increasing the voltage applied to the device by a drift current and/or space charge current and spreading current due to the stripe structure are neglected.

From FIG. 4, it is clear that, except in the case that the optical power reflection coefficient is very close to unity, the power consumption of a semiconductor laser having a resonator whose length is equal to or shorter than about 10 to 20 μm is substantially constant, regardless of the variation of L. For example, for values of R of 0.3, 0.5 and 0.7, the power consumption is equal to about 1.3 mW, about 0.8 mW and about 0.4 mW, respectively. That is, once the reflection coefficient R at the end faces of the semiconductor laser is determined, the power consumption at the laser threshold value is substantially fully determined thereby, with the exception of the case where the reflective coefficient R is very close to unity. In the latter case, the power consumption decreases in proportion to the length L of the resonator. In order to realize a power consumption of 1 mW per laser, the reflection coefficient R should be larger than 0.4 and the product of the stripe width and the resonator length should be less than 130 μm$^2$. For different semiconductor material than GaAs, this product should be less than approximately $$130 \times (Eg_B/Eg_A) \mu m^2,$$

where the $Eg_A$ is the bandgap of GaAs and $Eg_B$ is the bandgap of the different material.

Figure 5:
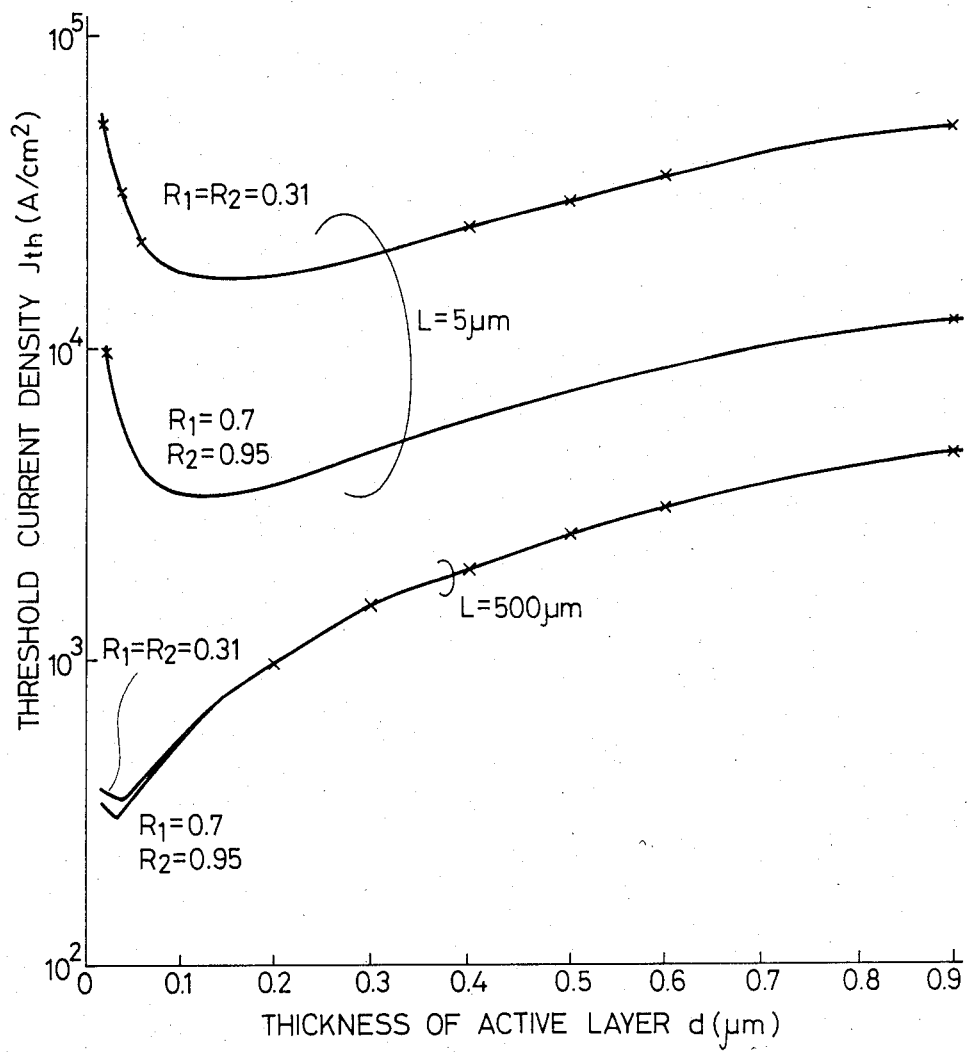

FIG. 5 shows the relation of the threshold current density to the thickness d of the active layer in cases where the resonator length L is 5 μm and 500 μm. In FIG. 5, $R_1$ and $R_2$ represent, respectively, the optical power reflection coefficients at the left and right end faces of the resonator. For a resonator having L = 500 μm and $R_1 = R_2 = 0.31$ and for a resonator of L = 500 μm, $R_1 = 0.7$ and $R_2 = 0.95$, the threshold current density dependencies on the thickness of the active layer are very close to each other and exhibit minimum values at a thickness of 0.03 μm. For resonators having L = 5 μm and $R_1 = R_2 = 0.31$, and L = 5 μm, $R_1 = 0.7$ and $R_2 = 0.95$, respectively, the effect of thickness on the threshold current density varies considerably with the reflection coefficient, and exhibits minimum values for active layer thicknesses in a range from 0.1 μm to 0.2 μm. That is, with a resonator length 20 μm or less, the mirror loss becomes very high and the minimum threshold current density is influenced considerably by the light confinement coefficient.

A laser having a conventional resonator exhibits a minimum threshold current density at active layer thicknesses in a range of about 0.05 μm to 0.1 μm. However, in a GaAs-GaAlAs laser, for example, having a shorter resonator whose difference in refractive index between an active layer and a cladding layer is 5%, the minimum threshold current density is generally in a range of 0.1 μm to 0.2 μm for d. Generally speaking, the optimum thickness of the active layer has a range of $0.4(\lambda/n) \lesssim d \lesssim 0.8(\lambda/n)$ for the threshold current.

Figure 6:
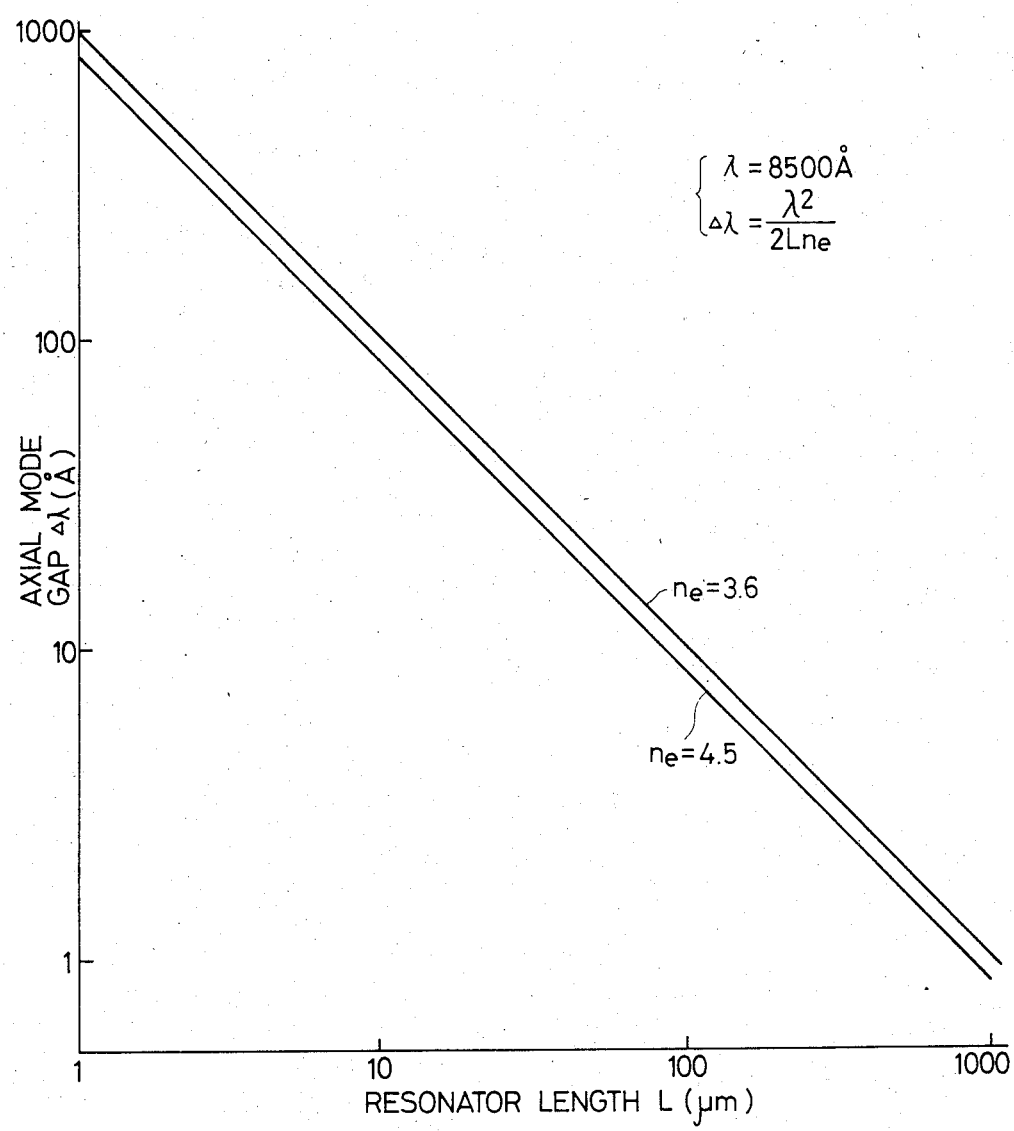

Another factor to be considered in shortening the resonator is the interval of the axial mode. That is, when the resonator is made shorter, this internal becomes larger, causing the threshold current to be increased when the frequency at which the maximum gain of the laser is obtained and the resonance frequency of the axial mode are not coincident because the gain is reduced in this case. FIG. 6 shows the relation between the resonator length and the interval of the axial mode. Assuming a laser output of $\lambda = 8500$ Å and $n = 3.6$, the axial mode differences $\Delta\lambda$ of resonator lengths 10 μm and 5 μm, for example, are nearly equal to 100 Å and 200 Å, respectively. With a conventional resonator of a length of about 400 μm, it becomes nearly equal to about 3 Å, and thus there is no need to even consider the frequency at which the gain becomes a maximum.

Figure 7:
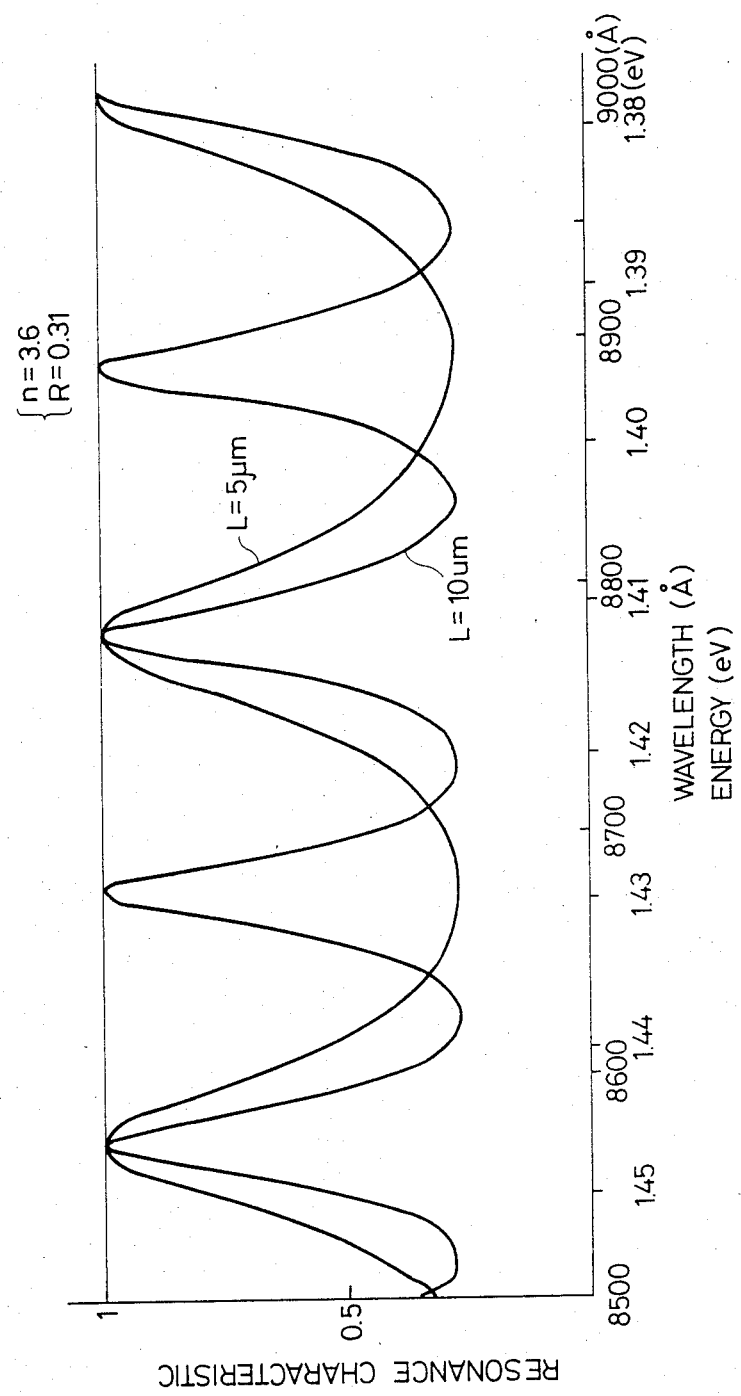

FIG. 7 shows the relation between the wavelength and resonance characteristic for resonators having a common reflectivity of 0.31 and lengths of 5 μm and 10 μm, respectively. For a resonator of a length of 5 μm, resonant frequencies occur at values corresponding to wavelengths separated from each other by about 215 Å. A resonator 10 μm in length resonates at frequencies corresponding to wavelengths separated from each other by about half of 215 Å. Since the reflectivity of a resonator is 0.31, certain electromagnetic wave modes may occur at wavelengths corresponding to minimum gain points between the resonance wavelengths where the gain may be about 0.28 times the maximum gain. The wavelength selectivity of such a resonator is relatively low, which makes it difficult to operate at a single frequency.

As mentioned previously, a shorter resonator is accompanied by a larger mirror loss, making it necessary to increase the mirror reflectivity so that the threshold current is restricted to a low value.

Figure 8:
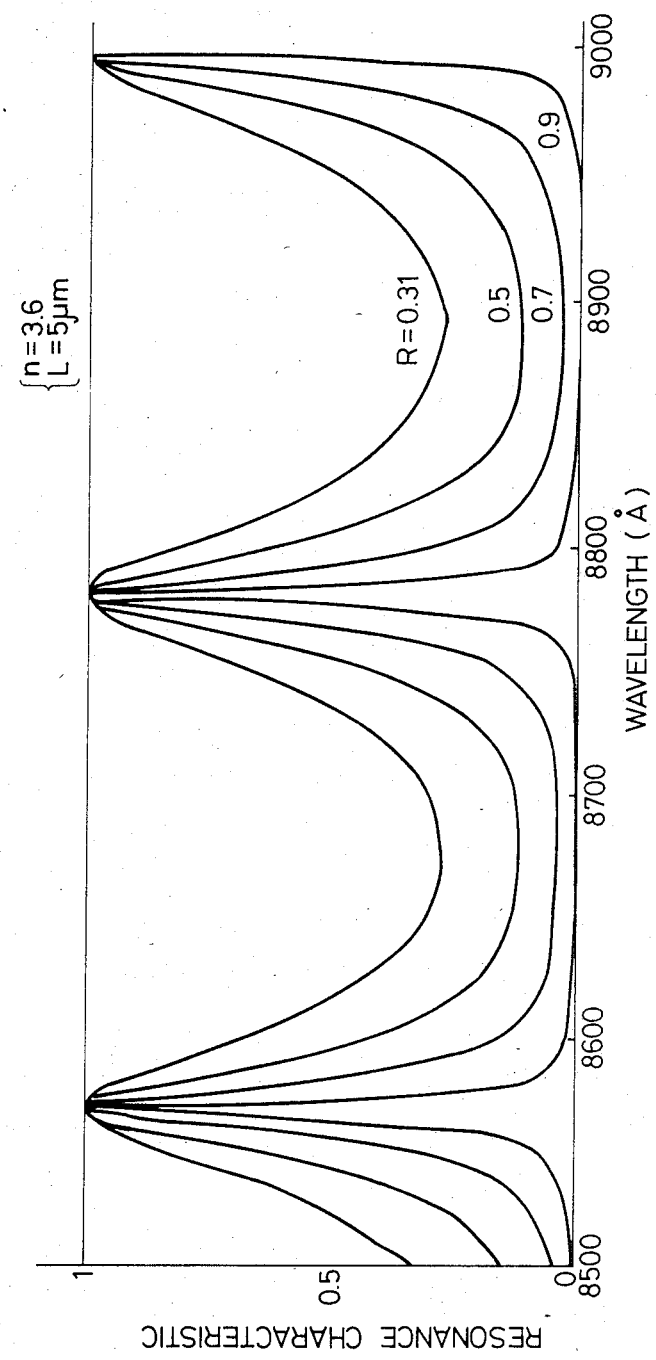

FIG. 8 shows characteristics of resonators, each of 5 μm length and having reflectivities R at end faces thereof of 0.31, 0.5, 0.7 and 0.9, respectively. As is clear from FIG. 8, the higher the reflectivity at the end faces of the resonator, the narrower the half-value width of the resonance wavelength and the smaller the gain at wavelengths between resonance wavelengths. That is, the wavelength selectivity can be increased by increasing the reflectivity. Therefore, it becomes necessary to make the maximum gain of a laser occur at exactly the resonance wavelength of the resonator.

Figure 9:
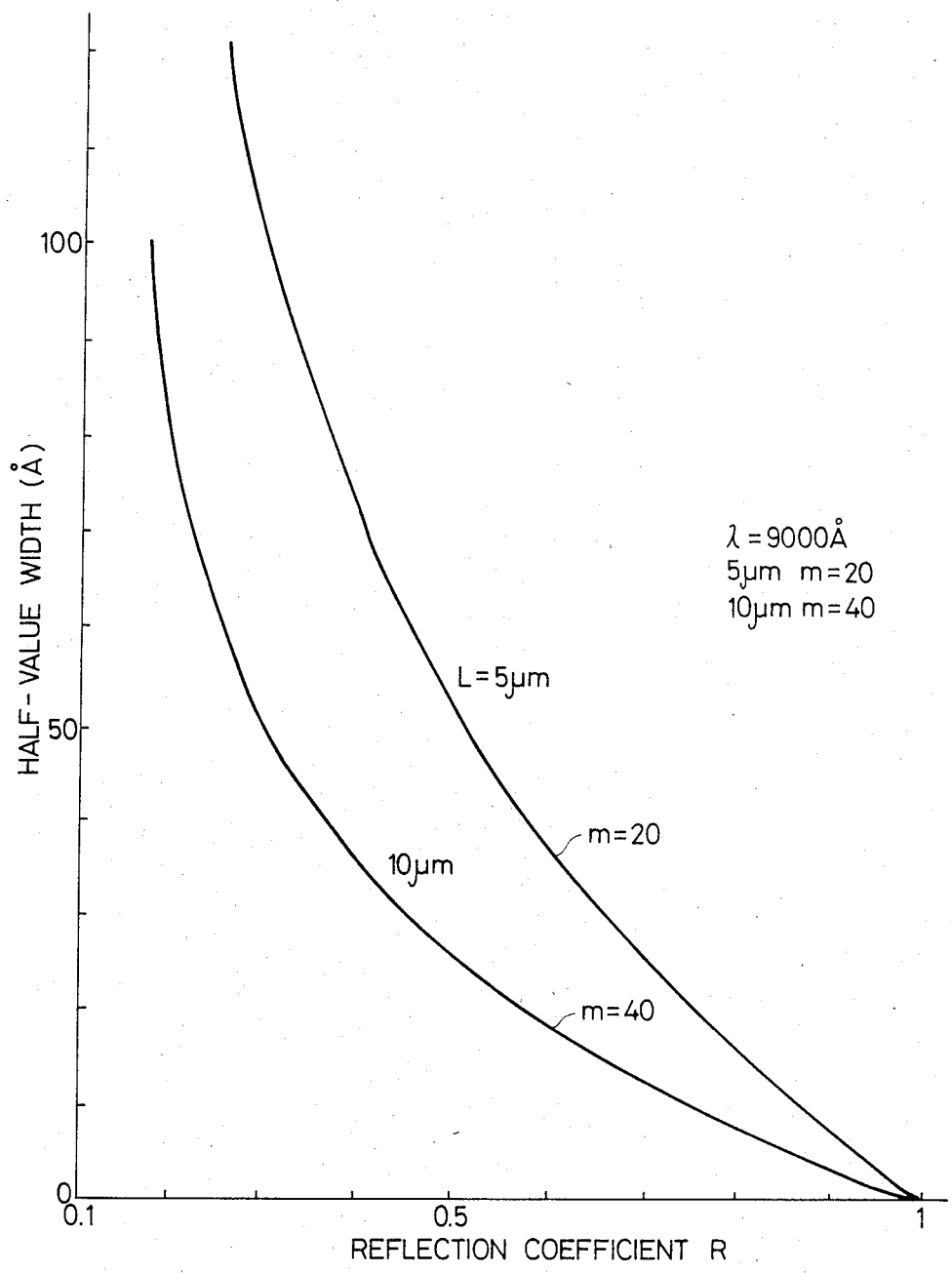

FIG. 9 shows relations between the full with at half maximum $\Delta\lambda$ (Å) of a resonator and the reflectivity R at the end faces of the resonator with the length of the latter as parameter. From FIG. 9, with a resonator 5 μm long, for values of R of 0.3, 0.5, 0.7 and 0.9, the full width at half maximum $\Delta\lambda$ is 100 Å, 52 Å, 31 Å and 7.5 Å, respectively. Therefore, in order to obtain effective laser oscillation at a specific wavelength, it is necessary to make the location of the maximum gain occur at a wavelength at least within this full width at half maximum. For a resonator of length 10 μm, the full width at half maximum is half that in the former case.

Figure 10:
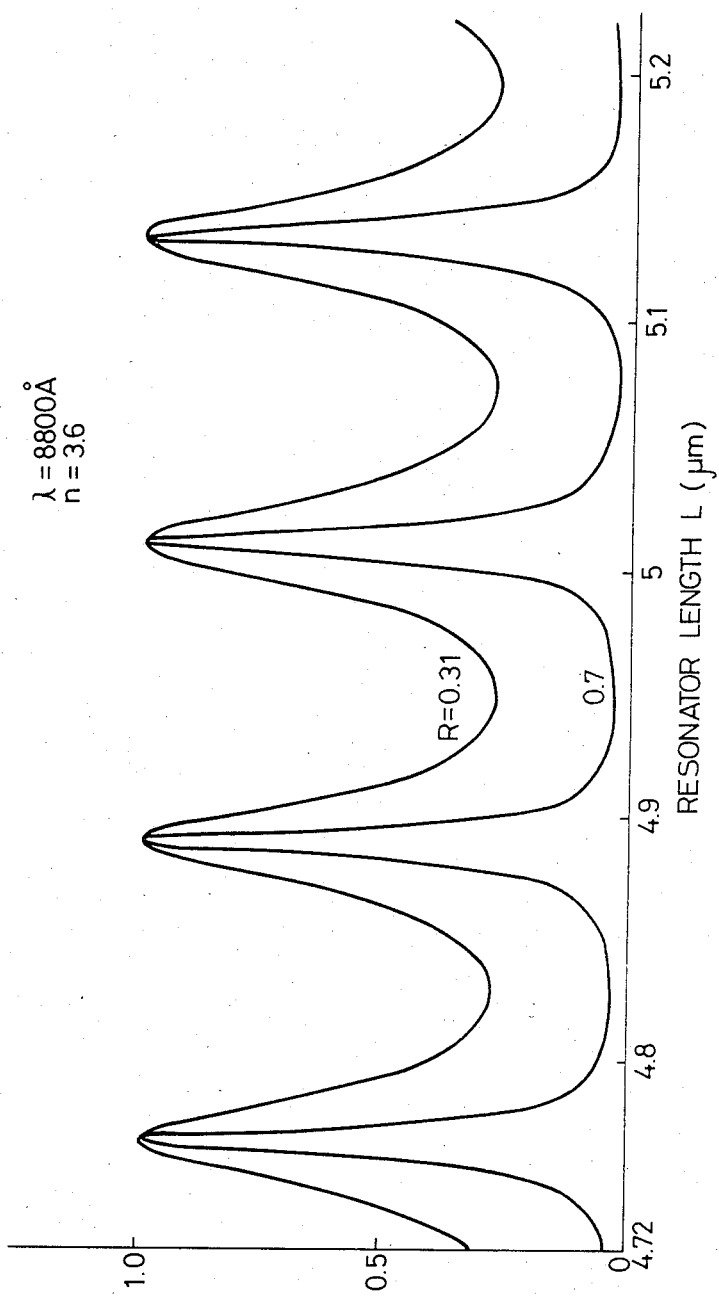

FIG. 10 shows the variation of the resonance characteristics with the length of the resonator. It is assumed that a resonator is employed whose resonance wavelength and refractive index are fixed at 8,800 Å and 3.6, respectively, and which has reflectivities R at end faces thereof of 0.31 and 0.7. The resonators resonate at intervals corresponding to half of the laser oscillation wavelengths in a dielectric body. With increased reflectivity at the end faces, the resonance curves become very sharp, and thus it becomes impossible to obtain a laser oscillation output at a specific wavelength unless the dimensions of the resonator are very exactly determined.

That is, although there may easily be a laser oscillation because of the interval of resonance frequency is short in the case of a long laser whose resonator length is 100 μm or more, it becomes difficult to obtain a laser oscillation with a short resonator whose length is 50 μm or less because the interval of the axial mode thereof becomes larger. As mentioned previously, when $L = 10$ μm, the interval of the axial mode is about 100 Å and, therefore, in order to make the oscillation frequency substantially equal to the frequency at which the maximum gain is obtained, the device must be dimensioned very precisely.

It is well known that the resonance wavelength of a laser can be obtained approximately as:

$$m\lambda_0/2 = nL,$$

where $\lambda_0$ is the laser light wavelength in free space, m is an integer, n is the refractive index, and L is the length of the resonator. Assuming $n = 3.6$, $m = 40$ and $\lambda_0 = 9000$ Å, the resonator length L will be 5 μm. There will then be a standing wave of 20 laser light wavelengths in the resonator. The output laser beam will have a wavelength of about 0.9 μm. In order to restrict the laser wavelength within $\lambda_0 \pm \Delta\lambda = 9000 \pm 100$ Å, the length of the resonator should be set within a range of $L \pm \Delta L$. Since $\Delta L = \Delta\lambda/\lambda L$, $\Delta L$ is 0.056 μm in this case, implying that the resonator must be dimensioned precisely with a tolerance equal to or smaller than $\pm 0.056$ μm.

The resonator length L of a semiconductor laser should be at least 10 wavelengths to make it operable in the waveguide mode, that is, it should be about 2.5 μm for a GaAs laser and about 5 μm for a InP laser. For the short resonator, the length may be in a range of several wavelengths to about 200 wavelengths. For a case when the length exceeds 200 wavelengths, there is no need to even consider the maximum gain point because the interval of the axial mode becomes so narrow as mentioned previously.

Figure 11A:
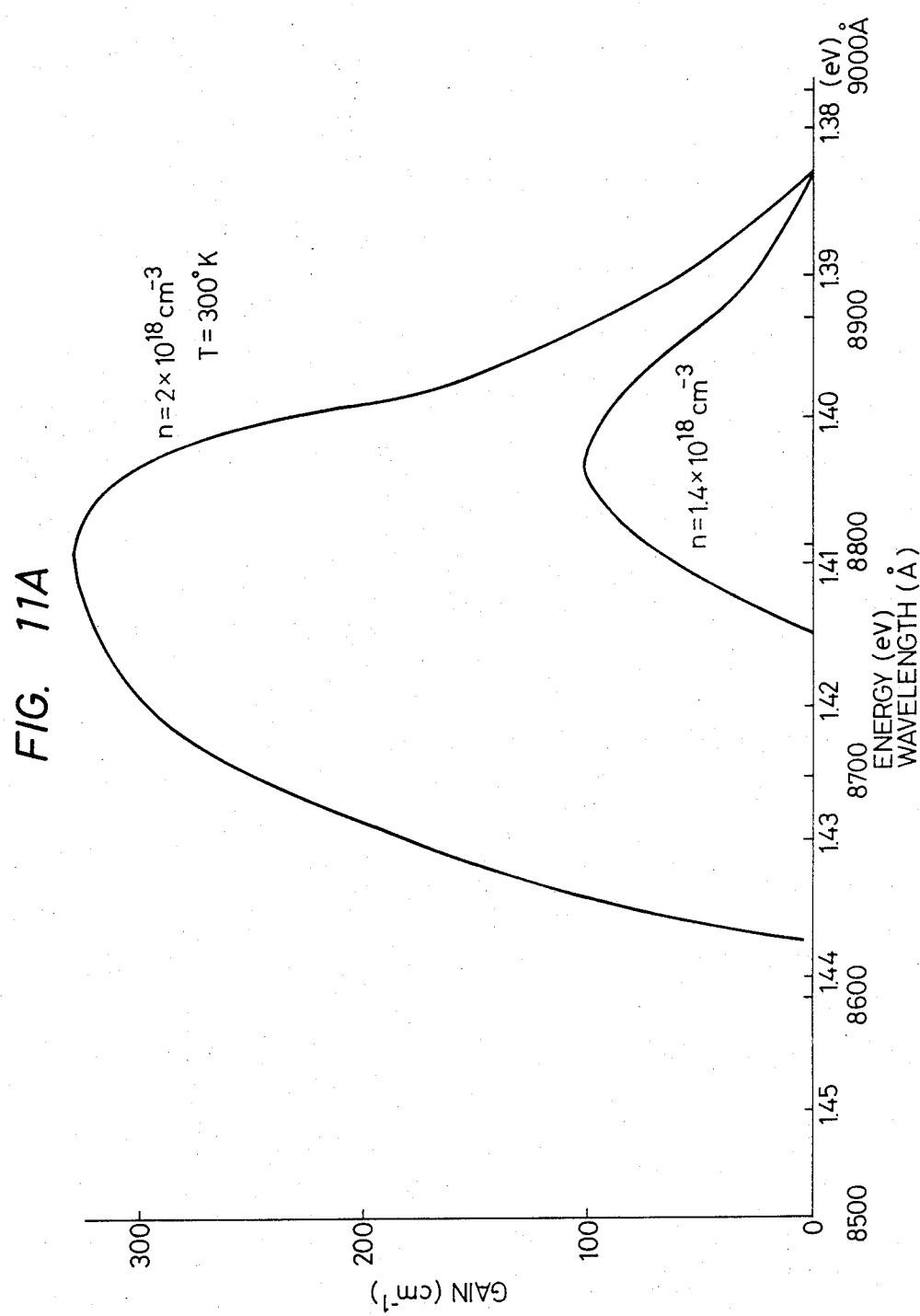
FIGS. 11A, 11B and 12 are graphs used to explain a current-gain characteristic.

FIG. 11A shows theoretical gains when $p^+$ GaAs is used as the active layer with the injected carrier density as a parameter. The maximum gain is obtained at a wavelength of 8,840 Å when the carrier density is $1.4 \times 10^{18}$ cm$^{-3}$. In this case, the wavelength range $\Delta\lambda$ which the gain becomes larger than 100 cm$^{-1}$ is about 150 Å. With $n = 2 \times 10^{18}$ cm$^{-3}$, a value of $g_{max} = 320$ cm$^{-1}$ is obtained at $\lambda = 8,793$ Å and $\Delta\lambda \cong 300$ Å.

As mentioned previously, the interval of the axial mode of a GaAs resonator 10 μm long is about 100 Å, and that of one 5 μm long is about 200 Å. An effective laser oscillation is obtained at the coincidence of the maximum resonance point with the maximum gain point.

Figure 11B:
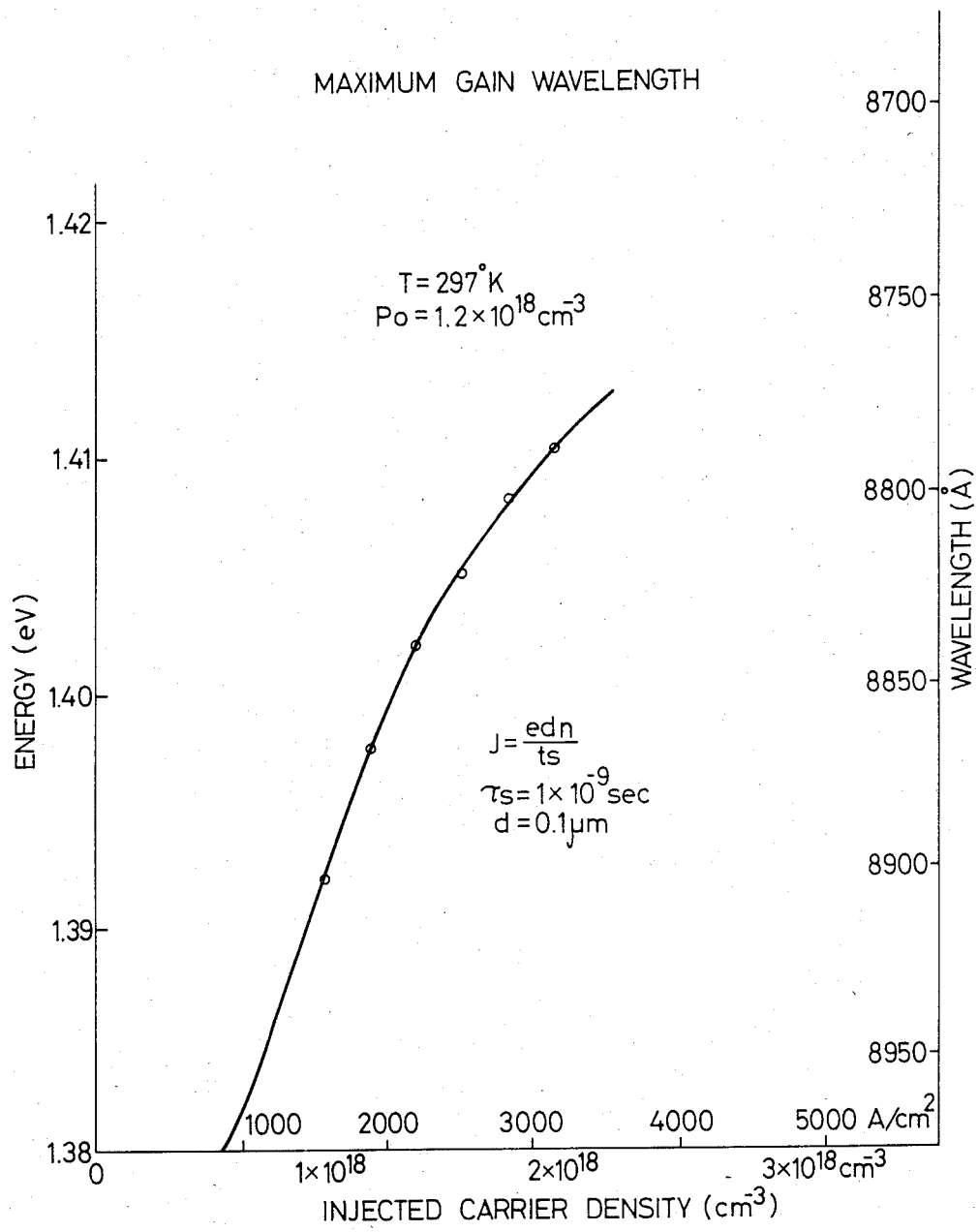

FIG. 11B shows the relation between the injected carrier density n and the wavelength $\lambda_{max}$ at which the maximum gain is obtained. The relation is linear for low current density regions, becoming gradually saturated. The relation between the carrier density n and the current density J can be represented by the following equation:

$$J = edn/\tau_s,$$

where e is the electron charge ($1.602 \times 10^{-19}$ coulombs), d is the thickness of the active layer, and $\tau_s$ is the spontaneous lifetime of the carriers. Therefore, assuming $d = 0.1$ μm, $\tau_s = 1 \times 10^{-9}$ sec and $n = 1 \times 10^{18}$ cm$^{-3}$, the current density J is 1600 A/cm$^2$, and is substantially proportional to the thickness of the active layer. The relations shown in FIGS. 11A and 11B are for lasers having resonators whose active layers are made of p$^+$-type GaAs. The active layer may also be a high resistivity layer, for instance. The characteristics of FIG. 11 change according to the characteristics of the active layer.

Figure 12:
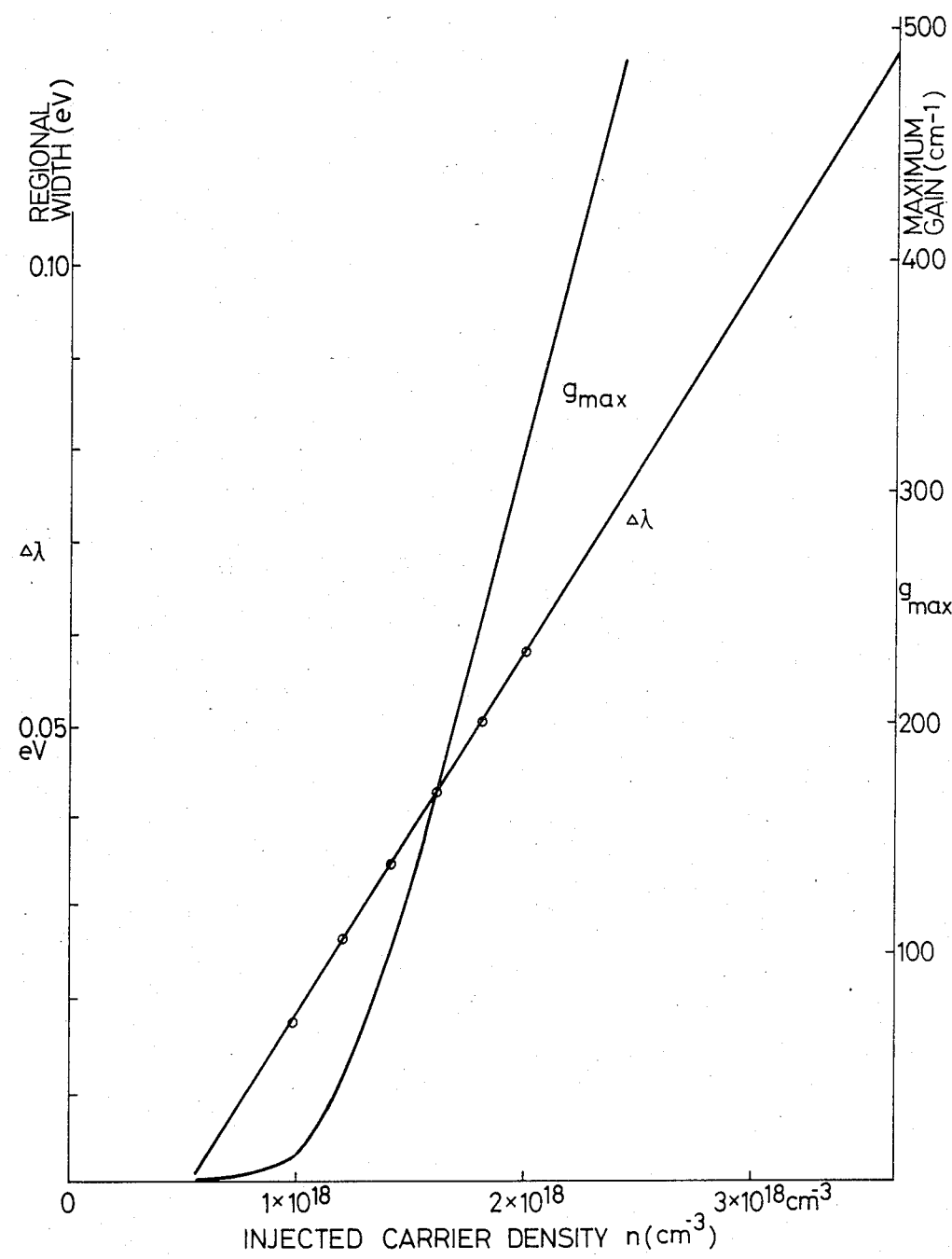

FIG. 12 shows the relation between the injected carrier density n and the maximum gain $g_{max}$ and the relation between n and the photon energy width $\Delta\lambda$ (ev) for positive gain. Laser oscillation occurs when the gain equals the loss to the optical cavity. This gain can be represented by the following equation:

$$g = \alpha_i + \frac{1}{L} \ln \sqrt{\frac{1}{R_1 R_2}} \quad (2)$$

where $\alpha_i$ is the energy loss due to absorption and scattering in the interior of the semiconductor material, (1/L) ln (1/R) is the mirror loss, L is the resonator length and $R = \sqrt{R_1 R_2}$ is the effective reflection coefficient at the end faces of the resonator. Assuming, for example, $L = 10$ μm, $\sqrt{R_1 R_2} = 0.8$ and $\alpha_i = 10$ cm$^{-1}$, laser oscillation occurs at $g \simeq 240$ cm$^{-1}$, for which the current at which a carrier density $n = 1.8 \times 10^{18}$ is realized is the threshold current density, as will be clear from FIG. 12, and the wavelength at which the gain becomes a maximum is 8,800 Å, as will be clear from FIG. 11B. The length $L_{res}$ of the optical cavity resonator should be made substantially equal to a value corresponding to this wavelength, i.e., 9.778 μm. Thus, it is possible to make the wavelength at which the gain becomes a maximum equal to the resonance wavelength. As another approach, the resonance wavelength may be made slightly different from the maximum gain wavelength, as will be described below.

In fabricating a semiconductor laser as part of an integrated circuit, it is important to make the current path stripe width as narrow as possible, in addition to making the resonator shorter. In narrowing this stripe, both current confinement and light inside of the stripe width must be considered. If these confinements are and effectively obtained, loss and power consumption would be made to increase. Optical confinement will be considered first.

Figure 13:
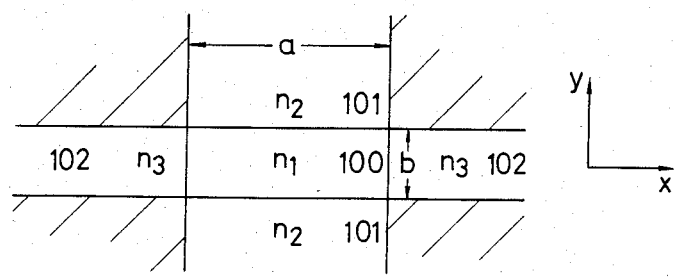
FIG. 13 shows an optical waveguide model.

FIG. 13 is a cross-sectional view of an optical waveguide model, wherein a light guide 100 is surrounded by regions 101 and 102. The guide 100 has a refractive index $n_1$, the region 101 has a refractive index $n_2$ and the region 102 has a refractive index $n_3$, with $n_1$ being greater than $n_2$ and $n_3$. Region 100 corresponds to the active region of a semiconductor laser, the light guide width a corresponds to the stripe width w, and the light guide thickness b corresponds to the thickness d of the active region. The hatched areas are neglected on the assumption that no light passes therethrough.

Figure 14:
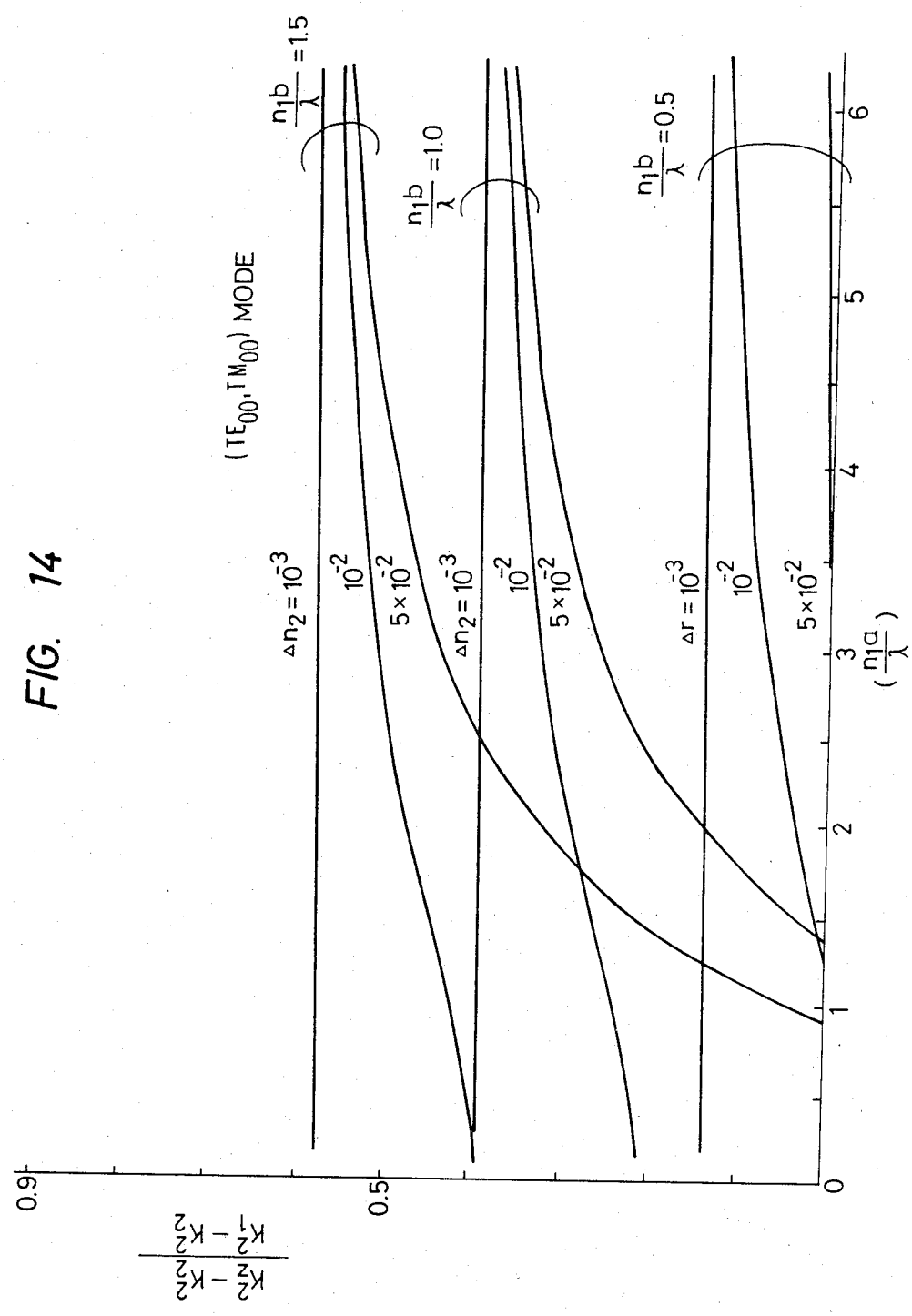
FIGS. 14 and 15 show characteristics of the optical waveguide.

FIG. 14 shows the dispersion characteristics of the optical waveguide of FIG. 13, wherein $$\Delta n_1 = (n_1 - n_2)/n_1$$

is constant at $5 \times 10^{-2}$ and $$\Delta n_2 = (n_1 - n_3)/n_1$$

and $$n_1 b/\lambda,$$

correlating the thickness b of the optical waveguide with the free spaces wavelength ($\lambda$), are plotted as parameters. The x-axis indicates $$n_1 a/\lambda,$$

correlating the width a of the optical waveguide with the free space wavelength $\lambda$, and the y-axis indicates $(k_\alpha^2 - k_2^2)/(k_1^2 - k_2^2)$ where $$k_1 = 2n_1/\lambda,$$

$$k_2 = 2n_2/\lambda,$$

and $k_\alpha$ is the wavenumber of the guided wave being propagated through the optical waveguide. If $(k_\alpha^2 - k_2^-)$ approaches $k_\alpha$ becomes equal to $k_2$, and this means that the light is propagated at the wavenumber of the cladding, which causes spreading over a wide area, and hence high losses. If $(k_\alpha^2 - k_2^2)/(k_1^2 - k_2^2)$ approaches $k_\alpha$ becomes equal to $k_1$, and this means that the light is substantially confined within the optical waveguide and the wavenumber is determined only by the refractive index $n_1$. Thus, the closer to one the value of $(k_\alpha^2 - k_2^2)/(k_1^2 - k_2^2)$, the better will be the optical waveguide characteristics.

In FIG. 14, the dispersion characteristic is shown for values of $$\Delta n_2 = (n_1 - n_3)/n_1$$

of $10^{-3}$, $10^{-2}$ and $5 \times 10^{-2}$ with values of $$n_1 b/\lambda$$

of 0.5, 1 and 1.5, respectively, on the condition that the propagation is in a fundamental mode (TE$_{00}$, TM$_{00}$). When the value of $$n_1 b/\lambda$$

is increased, the optical waveguide characteristics are improved, but if the former becomes greater than 1.5, higher order mode propagation begins and the threshold current of the laser is increased.

To minimize the threshold current, d is usually set in a range between 0.08 μm and 0.2 μm for a GaAs laser using a short resonator. This means that good results are obtained if $$n_1 b/\lambda$$

is greater than 0.5 and less than one. If $\Delta n_2$ is $10^{-3}$, the value of $(k_\alpha^2 - k_2^2)/(k_1^2 - k_2^2)$ is substantially constant, irrespective of the optical waveguide width a. This means that the light is not effectively confined in the transverse direction. When the value of $\Delta n_2$ increases to $10^{-2}$ or $5 \times 10^{-2}$, the optical waveguide characteristics become more dependent on the optical waveguide width, and they are significantly impaired when $$n_1 a/\lambda$$

becomes less than 2 or 3. (To determine the exact limit on the reduction in the stripe width, a calculation must be made to determine the confinement coefficient of the optical waveguide.)

Figure 15:
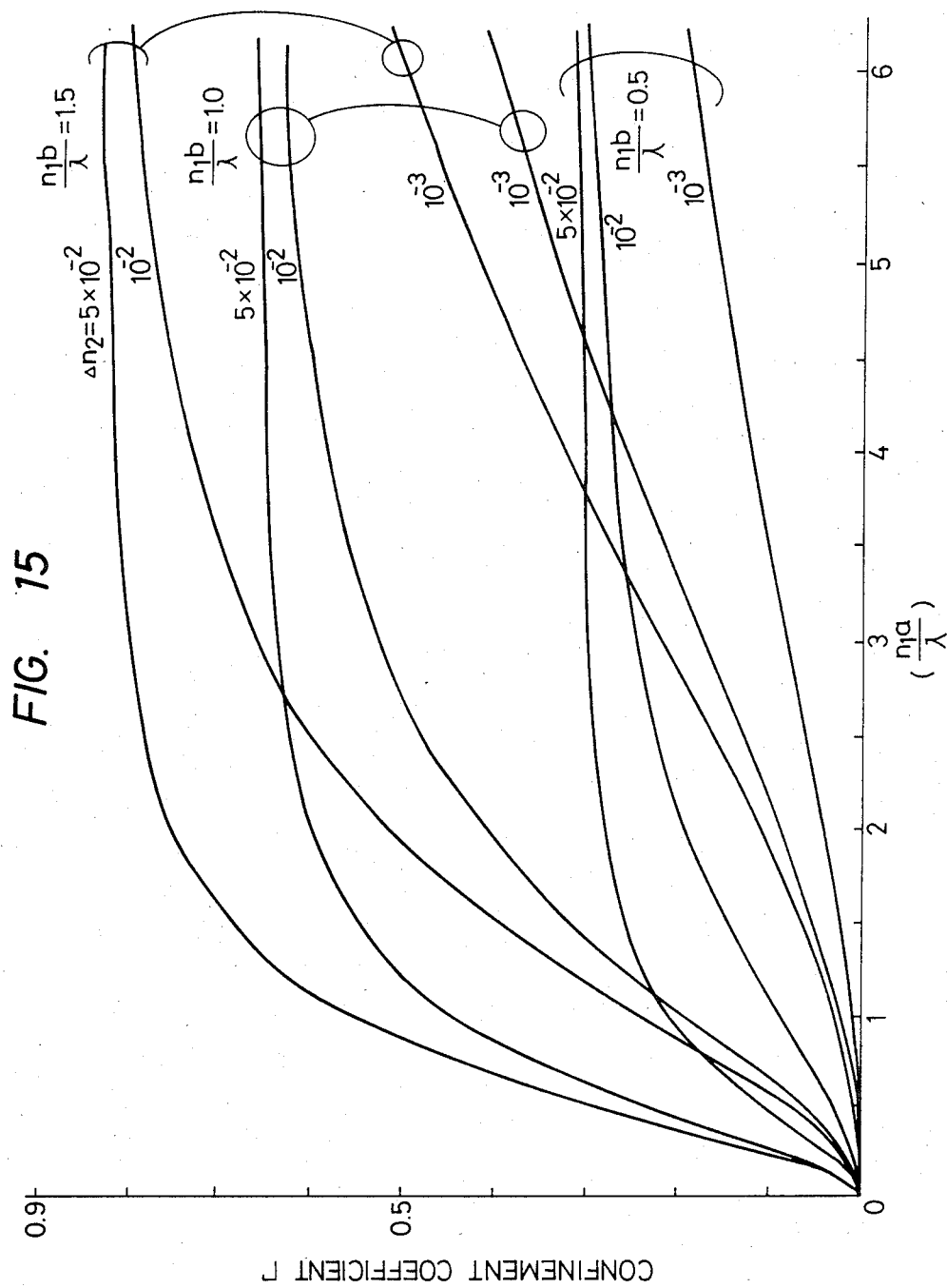

FIG. 15 shows the relation between the confinement coefficient $\Gamma$ and $$n_1 a/\lambda$$

corresponding to the stripe width. The confinement coefficient $\Gamma$ indicates the intensity of light present within the area of the optical waveguide ($a \times b$) compared with the total intensity of light present in the total area of the device. The closer to one the value of $\Gamma$, the more light is confined in the core or the active region. If $\Delta n_2 = 5 \times 10^{-2}$, $$n_1 a/\lambda$$

can be made smaller, within a range of 1 to 2. If $n_2 = 10^{-2}$, the limit on $$n_1 a/\lambda$$

is between 2 and 3, and if $n_2 = 10^{-3}$, the confinement coefficient cannot be made greater, even if $$n_1 a/\lambda$$

is between 5 and 6. That is, $\Delta n_2$ must be greater than a certain value to obtain good light propagation characteristics and to lower the threshold current density. The effect of $\Gamma$ is apparent from the equation (1). If it is smaller than one, the apparent internal loss and the mirror loss are increased. From FIG. 15, it is clear that the product of a and b should be larger than about $$(\lambda/n_1)^2.$$

This is the lower limit of the cross sectional area for the optical waveguide.

In a double-heterojunction structure, satisfactory carrier confinement can be effected in the direction perpendicular to the heterojunction (shown in FIG. 1) by making the band gap of the active layer somewhat smaller than that of the cladding. This is not, however, the usual case for the direction parallel to the heterojunction, the only exception being the buried heterojunction (BH) laser or the transverse junction stripe (TJS) laser. In other words, carriers can be confined in the direction parallel to the stripe width by forming a heterojunction structure in the transverse direction or by forming a potential barrier of opposite conductivity type.

In view of the conditions hereinbefore discussed, preferred embodiments of the present invention will now be described.

Figure 16:
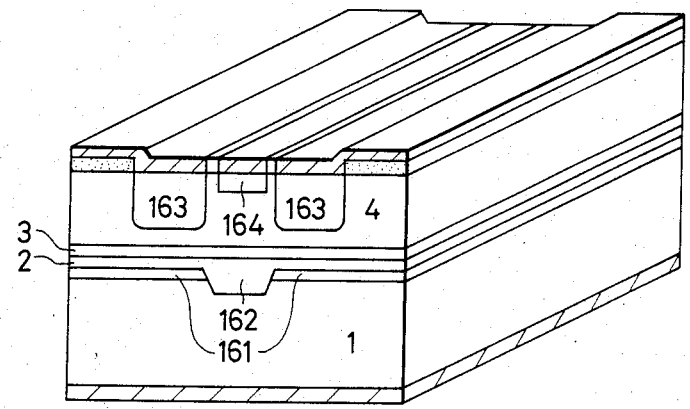
FIG. 16 shows a three-terminal type semiconductor laser.

FIG. 16 shows a semiconductor laser having a three-terminal structure, in which reference numerals 1 to 4 indicate the same elements as in FIG. 1. Further, n+ regions 163 are provided which function as gates. The laser has a p+ region 164 of high doping density between the regions 163. The region 164 functions as a cathode, while the region 1 functioning as an anode. The conductivity types of these regions may be reversed if desired. The operation of a semiconductor laser having a gate structure as shown in FIG. 16 is disclosed in U.S. Patent Application Ser. No. 411,080, filed Aug. 24, 1982, now U.S. Pat. No. 4,534,033, by the same inventors as the present invention. The region 4 is a relatively high resistivity region. By applying a forward voltage to the gate, a current is made to flow therein. To limit the current to a value lower than the threshold value, the voltage applied to the gate can be reduced to zero or a reverse gate bias voltage applied. Carrier confinement in the lateral direction can be effectively performed by this technique.

Regions 161 are provided which are made of a material of the opposite conductivity type to that of the substrate 1 and which have a refractive index greater than that of the cladding layer 2. GaAs for a laser of a GaAs and GaAlAs material system is suitable. The regions 161 function to effectively confine the carriers injected from the side of the substrate in the lateral direction. Further, the layer 2 is formed with a thickened portion 162 to improve the light confinement in the widthwise direction of the stripe. In the areas of the semiconductor layer 2 other than the thickened portion 162, a fraction of the guided light will reach the substrate 1 as well as the regions 161 in which it is absorbed. To the contrary, there is no such absorption in regions corresponding to the thickened region. Therefore, the effective absorption coefficient of regions of the optical waveguide other than the regions corresponding to the thickened region is high compared with that of the latter region. Due to the difference in effective absorption coefficients between those regions, the guided light is confined in the direction parallel to the junction plane, and laser oscillations in a stable lateral mode can occur in a portion of the semiconductor layer 3 which is above the thickened region.

The optical waveguide characteristics depend on a difference $\delta\eta$ in complex refractive indices between portions with and without a groove.

$$\delta\eta = \Delta n + i(\Delta\alpha/2K_0),$$

where $\Delta n$ is the difference in the effective refractive indices, $\Delta\alpha$ is the difference in the effective absorption coefficients, $i = \sqrt{-1}$ and $K_0$ is the wavenumber in free space. The difference in the complex refractive indices varies with the active layer thickness d (μm) and the cladding layer thickness t (μm).

Figure 17A:
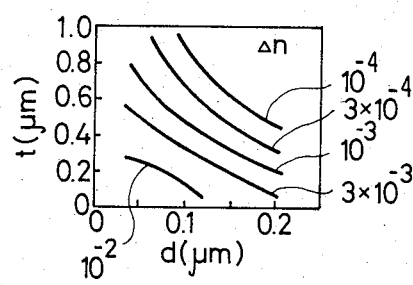
FIG. 17 shows a lateral mode stabilization characteristic of the laser of FIG. 16.
Figure 17B:
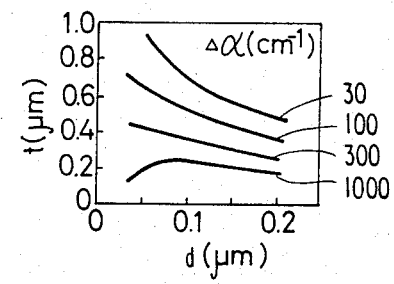

FIGS. 17A and 17B show the relations between the active layer thickness d (μm) and the thickness t (μm) of a cladding layer for laser diodes as parameters of the effective refractive index difference $\Delta n$ and the effective absorption coefficient difference $\Delta\alpha$, respectively, for a GaAs and $Ga_{0.7}Al_{0.3}As$ laser with an absorption coefficient α of the substrate of 8,000 cm$^{-1}$. For, for example, for a GaAs or Ga$_{0.7}$Al$_{0.3}$As (DH) laser having an active layer thickness d of 0.1 μm and a cladding layer thickness t of 0.3 μm, the difference in the effective refractive indices is:

$$\Delta n_{eff} = 4 \times 10^{-3} + i(500/2K_0),$$

where $4 \times 10^{-3}$ relates to the actual refractive index variation and 500 (cm$^{-1}$) corresponds to the light absorption loss. With t being about 0.1 μm, the real part of the refractive index difference is nearly equal to $1 \times 10^{-2}$, and hence satisfactory light confinement is realized.

Returning to FIG. 16, the impurity concentration of the n$^+$ substrate 1 is about $1 \times 10^{18}$ to $1 \times 10^{19}$ cm$^{-3}$, the thickness of the n$^+$ GaAlAs layer 2 is about 0.05 to 0.5 μm, the impurity concentration of this n$^+$ GaAlAs layer is on the order of $5 \times 10^{17}$ to $1 \times 10^{19}$, the thickness of the region 162 is 1 to 5 μm, the thickness and impurity concentration of the region 161 of p$^-$-type GaAs are 0.5 to 5 μm and $1 \times 10^{17}$ to $1 \times 10^{19}$ cm$^{-3}$, respectively, the active layer thickness is 0.05 to 0.5 μm, the thickness and impurity concentration of the p$^-$-type GaAlAs layer is 0.5 to 3 μm and about $1 \times 10^{13}$ to $1 \times 10^{16}$ cm$^{-3}$, respectively, the impurity concentration of the p$^+$ cathode region 164 is about $1 \times 10^{18}$ to $1 \times 10^{19}$ cm$^{-3}$, and the impurity concentration of the n$^+$ gate region is about $1 \times 10^{18}$ to $1 \times 10^{20}$ cm$^{-3}$. The distance W between the gates, that is, the channel width, is about 0.3 to 3 μm. Assuming that the channel length D is determined by the gate depth, and representing the impurity concentration of the channel by N, when NW$^2 < 2 \times 10^7$ cm$^{-1}$ and D/W > 1, the device is of the normally off type.

The current through the semiconductor laser in FIG. 16 is controlled by the gate. That is, the laser oscillation current is obtained by applying a forward vias voltage to the gate sufficiently high to cause a current to flow which exceeds the threshold value. However, it may be possible to operate the device by widening the channel so that a desired amount of current will flow even under a zero gate bias. In the latter case, a reverse bias voltage may be applied thereto to make the current zero. Further, with the carrier concentration in the channel region being higher than the above, anode-cathode current control by the gate voltage becomes difficult. In such a case, the gate region may be used only to confine the carrier flow and the gate function thereof may be lost.

Also, although the layer 4 is GaAlAs in FIG. 16, it is possible to form a GaAs layer thereon to decrease the ohmic resistance thereof. Further, it should be noted that the conductivity types of all of the regions may be reversed and that this structure may also be applied to devices using the InP-InGaAsP system and other materials. In summary, the features of the semiconductor laser shown in FIG. 16 are that transverse carrier confinement is performed by the gate and an optical waveguide having width substantially equal to that of the gate is provided. In the conventional channeled substrate planar laser of GaAs, the threshold current density drastically increases for the narrow stripe width (less than about 2 μm) because of poor carrier confinement. However in this embodiment, the threshold current density does not increase in the case of the narrow stripe (less than about 2 μm = 8(λ/n)) because of the carrier confinement.

Figure 18:
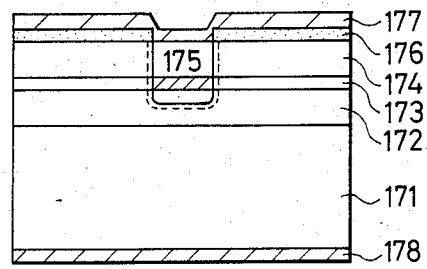
FIGS. 18 through 23 are cross-sectional views of embodiments of semiconductor lasers of the invention, each having a narrow width.

FIG. 18 is a cross-sectional view of another embodiment, taken transverse to the stripe thereof. This embodiment includes an n$^+$ GaAs substrate 171, an n$^+$ GaAlAs region 172, an n GaAs active layer 173, an n GaAlAs region 174 and a p$^+$ region 175. There are two types of pn junction in this structure, a GaAs pn junction and a GaAlAs pn junction. The junctions between the regions 174 and 175 and between the regions 172 and 175 are GaAlAs pn junctions, while the junction between the regions 173 and 175 is a GaAs pn junction. Since the band gap of a GaAs pn junction is different from that of a GaAlAs pn junction, there may be a considerable difference in currents flowing therethrough for the same applied voltage. The ratio of forward current flowing through a GaAs junction to that flowing through a GaAlAs junction can be represented as:

$$i_n/i_N \cong \exp(\Delta E_g/kT), \quad (3)$$

where k is Boltzmann's constant, T is absolute temperature and $\Delta E_g$ is the band gap difference. For Ga$_{0.7}$Al$_{0.3}$As, $E_g \cong 1.8$ eV, and for GaAs, $E_g = 1.42$ eV. Therefore, $\Delta E_g = 0.38$ eV and $i_n/i_N \cong 2.35 \times 10^6$ at room temperature. As a result, the current density of the GaAs pn junction is very large, that is, current flows through that pn junction in a high concentration. Practically, the ratio may be somewhat smaller than the above value because all areas of the junction should be considered.

Assuming a stripe width of 2 μm, the thickness of the layers 172, 173 and 174 may be 1 μm, 0.1 μm and 1 μm, respectively. In the device of FIG. 18, the area ratio of the pn junction to the pn junction is about 50, that is, $i_n/i_N \cong 5.9 \times 10^4$. However, the current leakage at the GaAlAs pn junction may be neglected and it can be assumed that the carriers are confined to the layer 173. On the other hand, since a current can flow through the pn junction in a direction perpendicular thereto, the current is confined in the active layer in FIG. 18. For compound semiconductor materials such as GaAs or InP which are commonly used for lasers, there is a large difference in the diffusion lengths of electrons and holes, specifically, the electron diffusion distance is larger than that for holes. Therefore, for a pn junction, the laser oscillations occur on the p-type side. Hence, the conductivity type of the region 175 should be p type. Since light-emitting spots at the two pn junctions may be separated unless the width of the region 175 is smaller than the electron diffusion length, stripe the width should be less than at least twice the electron diffusion length. For GaAs, assuming a spontaneous carrier lifetime $\tau_e = 1 \times 10^{-9}$ sec and a carrier concentration of $1 \times 10^{18}$ cm$^{-3}$, then $L_n \cong 2.8$ μm and $L_p \cong 0.7$ μm. If electrons flow into the region 175 from both sides thereof, separation of the light-emitting spots may be eliminated if the stripe width is equal to or smaller than about 5 μm. It is usual to use Zn as the dopant for the p-type region 175. For GaAs, doped with Zn, the density thereof is about $1 \times 10^{18}$ cm$^{-3}$, and the refractive index n of the region is about 10$^{-2}$ to 10$^{-3}$, resulting in good optical confinement.

Figure 19:
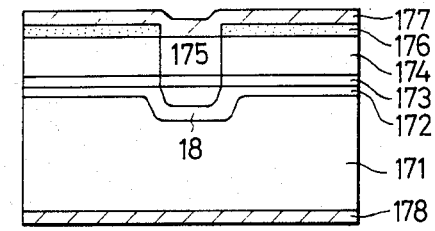

In the embodiment of FIG. 19, in addition to the increase of the refractive index of the optical waveguide portion due to the presence of the dopant of the p-type region, an effective refractive index difference is introduced by making the thicknesses of regions 172 and 180 different. The principle of this is similar to that of FIG. 16.

The layer 176 in FIG. 18 or 19 is an insulating layer of a material such as $Si_3N_4$, $SiO_4N_4$, AlN or $Al_2O_3$. The layer 176 may be omitted because the regions 174 and 177 are composed of ohmic metals of the n type and p type, respectively, and an n-type metal cannot be in low ohmic contact with a p type, resulting in substantially no current flowing through the contact portion between the regions 174 and 177. In FIGS. 18 and 19, if the layer 176 is omitted, the shallow p+ layer may be formed in the layer 174 and the electrode 177 may be directly contacted because GaAlAs pn junctions have a larger diffusion potential than GaAs pn junctions.

Figure 20A:
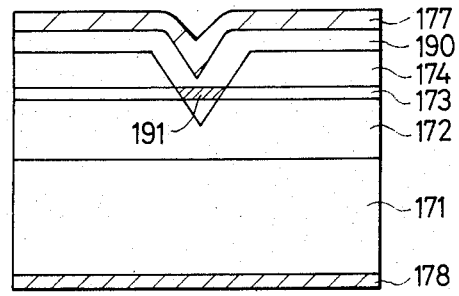
Figure 20B:
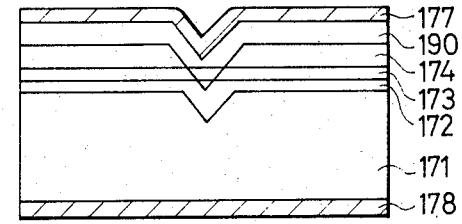

FIGS. 20A and 20B show another embodiment in cross section, in which regions 171, 172, 173 and 174 are the same as those in FIGS. 18 and 19. According to this embodiment, after the layers 172 to 174 are formed on the substrate 171 by crystal growth, a V groove is etched in the layer 174. Then the layer 190 of the opposite type to that of the region 171 to 174 is formed by diffusion or ion implantation to obtain the desired conductivity type. The layer 190 at least contacts the layer 173. In this embodiment, the hatched area 191 of the layer 173 is the laser oscillation portion, as in the embodiment in FIG. 18. With the structure of FIG. 20, it is possible to employ a narrower stripe width than in the structure in FIG. 18. That is, the region 175 or 191 is formed by some heat treatment subsequent to the diffusion process and ion implantation and the diffusion depth and the lateral diffusion thereof may be substantially the same. Therefore, if the diffusion is performed to a depth of, for example, 1 $\mu$m, the stripe width should be about 2 $\mu$m. For this reason, it is easy to obtain a strip width of less than 1 $\mu$m ($=4\cdot\lambda/\eta$) with a structure having a V groove as shown in FIG. 20A, which is difficult to achieve with the structure of FIG. 18. Further, in the embodiment in FIG. 20B, lateral light confinement in the laser oscillation portion is realized by providing a difference in effective refractive indices with an increased thickness of the layer 172 concomitantly with the bottom portion of the V groove, so that lateral mode stability is improved. Current confinement in the structure in either FIG. 20A or 20B is realized according to the same principle as mentioned with respect to the structure in FIG. 18, that is, by the difference in band gap of the materials. It is possible further to provide a GaAs layer on the layer 174 before diffusion or ion implantation processing for any of the structures shown in FIG. 18 to FIG. 20B. With such a GaAs layer on the layer 174, the ohmic contact resistance is lowered. Like for the structures of FIGS. 18, 19 and 20, when the barrier region 161 is formed at the substrate side, the threshold current density does not increase upon narrowing of the stripe width because of improved carrier confinement.

Figure 21:
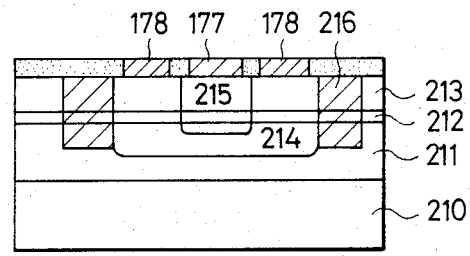

FIG. 21 shows an embodiment in which all of the electrodes are arranged on the upper surface of the semiconductor wafer so that incorporation of the semiconductor laser in an integrated circuit is facilitated. In FIG. 21, on a high resistivity GaAs substrate 210, a high resistivity GaAlAs layer 211, a high resistivity GaAs layer 212, and a high resistivity GaAlAs layer 213 are formed in that order. These high resistivity layers 211, 212 and 213 have low impurity concentrations. An n+ region 214 and a p+ region 215 are formed by double diffusion and/or double ion implantation or the like. A portion of the layer 212 within the region 215 functions as the active layer. Current flows in a direction parallel to the substrate surface of the active region. In order to minimize the leakage current, a high resistivity region 216 may be formed, such as by hydrogen ion implantation. Light and current confinements are realized according to the same principle as mentioned before. The substrate 210 and the layers 211 to 213 thereon may be n type. In the latter case, the structure thereof may be the same as shown in FIG. 18, except that surface wiring connections are possible for the structure of FIG. 21.

Figure 22A:
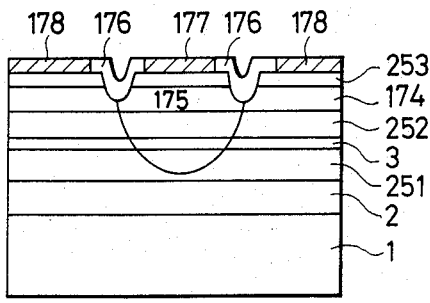

FIG. 22A shows the cross section of another embodiment of the present invention. In FIG. 22A, on an n+ GaAs substrate 1, an n $Ga_{1-z}Al_zAs$ layer 2, an n $Ga_{1-y}Al_yAs$ layer 251 whose composition gradually changes through the thickness thereof, an n GaAs layer 3, an n $Ga_{1-y}Al_yAs$ layer 252 whose composition gradually changes through the thickness thereof, an n $Ga_{1-z}Al_zAs$ layer 174, and an n GaAs layer 253 are formed in the stated order. The gradual compositional change of each of the layers 251 and 252 is very important and should be made such that the refractive index distribution n(x) is equal to $n_0(1-ax^2)$ as in a self-focusing optical waveguide (i.e., graded index optical waveguide).

Figure 22B:
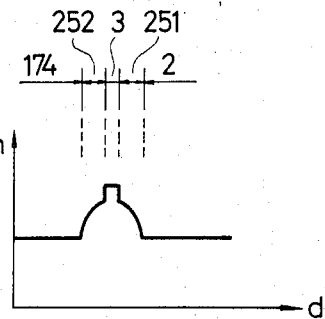

FIG. 22B shows the refractive index distribution in the waveguide portion of the structure shown in FIG. 22A. Although this distribution is for a device using the GaAs system, it is also applicable to other devices using other material systems.

Figure 23:
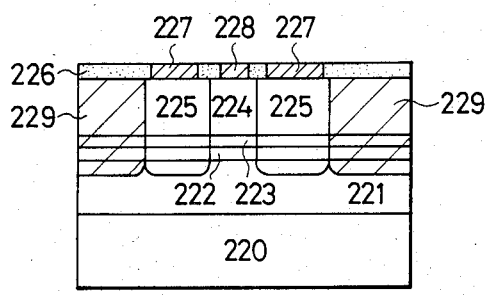

FIG. 23 shows yet another embodiment of a semiconductor laser of the invention in cross section. In FIG. 23, on a substrate 220 of, for example, GaAs, an n-type $Ga_{1-x}Al_xAs$ (x≅0.3) layer 221, a p-type $Ga_{1-x}Al_xAs$ layer 222, a p-type GaAs layer 223 and an n+-type $Ga_{1-x}Al_xAs$ layer 224 are formed in the stated order. A pair of p+-type regions 225 are formed continuously from an upper surface of the layer 224. A pair of electrodes 227 are provided on the p+-type regions 225, and an electrode 228 is provided on the layer 224. A pair of high resistivity regions 229 are also provided. Current flows mainly through a pn junction between the n+-type GaAlAs layer 224 and the p-type GaAs layer 223. There are also GaAlAs pn junctions formed between the region 224 and the region 225. However, current flows mainly through the former pn junction due to the difference in the band gaps. The p-type GaAlAs region 222 acts as a barrier when electrons are injected from the n-type GaAlAs region 224 to the p-type GaAs region 223. The thickness of the region 222 may be as small as about 100 Å since its only function is to act as a barrier for electrons. The thicknesses of the other regions may be the same as those of the preceding embodiment. The layer 223 acts as the active layer. The diffusion front of the region 225 may be in the layer 222.

The embodiments described hereinbefore are semiconductor laser structures which all exhibit good characteristics when the optical cavity length thereof is shortened and the stripe width thereof is narrowed. Embodiments to be described subsequently are particularly suitable to be constructed in integrated circuit form. For these semiconductor lasers, the stripe width should be larger than about ($\lambda$/n) in view of the optical confinement, as shown in FIG. 15.

Figure 24A:
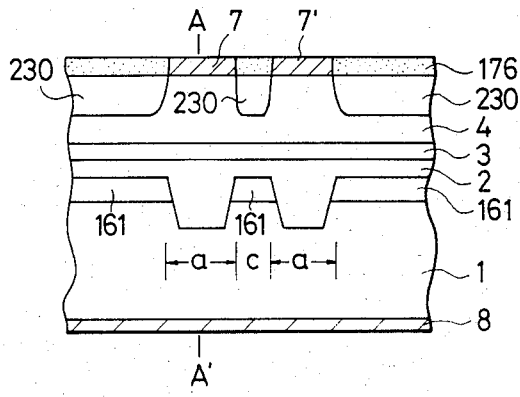
FIGS. 24A and 24B show an embodiment of a semiconductor laser in which optical coupling is increased.
Figure 24B:
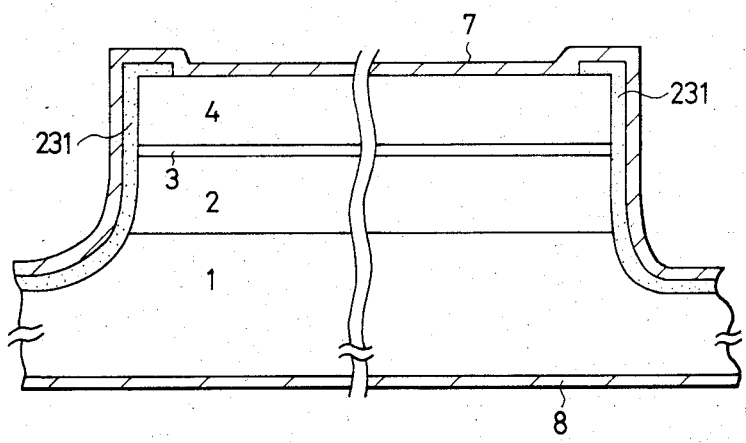

As mentioned previously, mirror loss becomes considerable if the optical cavity of a semiconductor laser is shortened. Therefore, it is effective to make the reflectivity at the end faces of the optical cavity large enough to minimize the mirror loss. One approach for realizing the short cavity semiconductor laser is to increase the reflectivity at the end faces of the laser optical cavity to nearly 100% and to guide laser light out to an optical waveguide provided parallel to the laser optical cavity by optically coupling them to each other. FIGS. 24A and 24B show an embodiment constructed according to the above approach in which FIG. 24A is a cross-sectional view taken transverse to the stripe and FIG. 24B is a cross-sectional view of the optical cavity taken along a line A—A' in FIG. 24A. In these figures, reference numerals 1, 2, 3, 4, 161 and 162 indicate the same or similar elements to those indicated by the same reference numerals in the previously described embodiments.

In FIG. 24A, the layer 4 has two protrusions, and thus there are two stripes formed. The layer 3 acts as the laser active layer as well as the optical waveguide. In this embodiment, one of the protrusions functions as the laser oscillation portion and the other functions as the waveguide portion so that the laser light is derived from the laser oscillation portion.

As shown in FIG. 24B, a region 230 is a separation portion for separately injecting carries from carrier injection electrodes 7 and 7' to the laser oscillation portion and the optical waveguide portion, respectively. The conductivity type of the region 230 is opposite that of the region 4, or, if desired, it may be a high resistivity region prepared by implanting $H_2$ or He or the like. In this embodiment, the portion associated with the electrode 7 acts as the laser oscillation element and that associated with the electrode 7' becomes the optical waveguide. As shown in FIG. 24B, the end faces are sharply dry- or wet-etched and then covered by insulating films 231 of materials such as AlN, $SiO_2$, $Si_3N_4$, GaN, BN or $Al_2O_3$. Thereafter, the metal layer 7, which may be made of Au, Al, Mo or W, etc. is formed to provide a reflective layer. The refractive indices n of AlN, $SiO_2$, $Si_3N_4$, GaN, BN and $Al_2O_3$ for $\lambda \cong 0.85$ $\mu$m are 2.2, 1.45, 2.0, 2.35, 2.2 and 1.75, respectively. With such an insulating layer and reflection layer, a mirror face whose reflectivity is substantially 100% can be provided, and thus the threshold current of the semiconductor laser can be reduced. The metal layer 7 may be made of the same material as that of the electrode and may be formed simultaneously therewith, as shown in FIG. 24B, or it may be formed separately from the electrode as long as a mirror face is formed using a metal having as high a reflectivity as possible. When the optical cavity the semiconductor laser is shortened, such as to 5 $\mu$m to 10 $\mu$m, it becomes important to make the maximum gain wavelength coincident with the resonance wavelength of the optical cavity and to define the optical cavity length exactly. It should be noted that when there is a variation in the insulating film thickness, the optical cavity length may be varied even if the resonator length is exactly defined.

The mechanism of reflection of light or electromagnetic waves by a metal will now be considered. When electromagnetic waves are irradiated on a metal, free electrons in the metal move according to the electromagnetic field of the irradiated electromagnetic waves, and because moving free electrons radiate the electromagnetic waves. The radiated electromagnetic waves interfere with each other to produce the reflected wave. Assuming that losses are very small and light energy is absorbed immediately while free electrons continuing to vibrate, the specific dielectric constant of the metal is:

$$\epsilon = 1 - (nq^2/m\epsilon_0\omega^2).$$

For $\lambda = 0.88$ $\mu$m, $\epsilon$ is negative and very high. As to the characteristic of electromagnetic waves, $$Z_0 = \sqrt{\frac{\mu_0}{\epsilon}} \cong 0.$$

This implies a short-circuited state.

On the other hand, the characteristic impedance of semiconductor material is 105 $\Omega$ for GaAs, as well as for $Si_3N_4$ and like materials, while for insulating materials, the value is about 188 $\Omega$. That is, the impedance of the metal seen from the semiconductor side is very small. In other words, the electric field of the light waves at the surface of a metal layer is substantially zero. If the thickness of the insulating layer sandwiched between the metal and the semiconductor laser is $\lambda/2$ times the wavelength in the insulating layer, where $\gamma$ is an integer, the optical standing waves have a nodal point at the end face contacting the insulating layer 231 of the semiconductor laser, and thus the electric field intensity thereat becomes very small. That is, by setting the nodal point of the standing waves at the end face, the electric field intensity thereat can theoretically be made substantially zero due to the nearly 100% reflection from the metal layer formed at the end face. This is very beneficial in view of the end face destruction problem at high laser output powers, which occur at high output levels when the standing waves have a peak at the end face of the resonator, causing the electric field intensity thereat to be a maximum. The thickness of the insulating layer may, however, be $(\gamma/2)\cdot(\lambda/n)$, where $\gamma$ is an integer, n is the refractive index of the insulating layer and $\lambda$ is the laser oscillation wavelength, because the refractive index depends principally upon the material of the insulating layer. This is also very beneficial when a high power semiconductor laser is fabricated as a discrete device.

Since, according to the present invention, the reflectivity at the end face can be as high as nearly 100%, the electric field intensities in interfaces between the semiconductor material and the dielectric material and between the metal and the dielectric material become nearly equal to zero, and therefore the degradation problem around the interfaces becomes negligible. That is, since the expected lifetime of a semiconductor laser is determined not by the lifetime of the interfaces but by the degradation of the material itself and thermal effects, the reliability of the laser can be remarkably improved. However, it is not always necessary to make the thickness of the dielectric material just equal to $(\gamma/2)\cdot(\lambda/n)$. That is, when the optical power at the interface is less than half of maximum, the thickness of the dielectric material may allow an error of $\pm(0.25\cdot(\lambda/2n))$. That is, when the optical power at the interface is less than half of maximum, the thickness of the dielectric matrial may allow an error of $\pm(0.25\cdot(\lambda/2n))$.

Further, due to the fact that light is reflected by a metal after a penetration to a certain depth thereinto, the thickness of the metal layer forming the mirror surface should be equal to twice the penetration depth or more. It is thus possible to obtain a reflectivity of nearly 100% by this thickness. The penetration depth depends upon the metal to be used and the wavelength of light.

If the thickness of the metal layer is smaller than the penetration depth, it becomes possible to regulate the reflectivity and transmission by the thickness of the metal layer. For example, for a Si₃N₄ insulating layer, the refractive index thereof is about 2.00, and therefore the thicknesses $\frac{1}{2}\cdot(\lambda/n)$, $\lambda/n$ and $(3/2)\cdot(\lambda/n)$ thereof should be 0.22 μm, 0.44 μm and 0.66 μm, respectively, for $\lambda=0.88$ μm.

In the embodiment of FIGS. 24A and 24B, it is possible to cause currents to flow both through the laser oscillation portion and the optical waveguide portion and through the electrodes 7 and 7'. As mentioned above, each of the end faces of the laser oscillation portion is provided with an insulating layer and a metal reflective surface thereon to make the Q of the resonator large and the threshold current very small. On the other hand, it is possible to sharply etch the one side of the optical waveguide from which no light is derived in a way similar to that of FIG. 24B, and then to provide an insulating layer and a metal reflective surface thereon. In this case, the other side of the waveguide from which light is derived is constructed to guide light to a predetermined point. It may be effective to pass a current also through the optical waveguide. The current should be limited to a certain value so that there not other oscillation but amplification occurs there, overcoming internal losses. If no such current is provided flowing through the optical waveguide, the active layer 3 should be a highly resistive layer of low doping density, otherwise the internal losses cannot be reduced.

The process for constructing the mirror surfaces at the end faces of the resonator of the invention will now be described. The end face of the semiconductor laser is etched by using a reactive ion etching (RIE) technique. That is, the wafer containing the heterojunction structure is etched using RIE. In order to uniformly etch the wafer, the chosen etchant gas should be one which reacts with the constituent elements of the semiconductor material to produce completely volatile materials. For example, in a GaAs-GaAlAs semiconductor laser, since chlorides of the respective constituent elements thereof are volatile materials having high vapor pressures, Cl₂, CCl₄ or CCl₂F₂, etc. should be used as the etchant gas.

Assuming RIE of a parallel plate-type electrode structure using CCl₂F₂, the etching rates for GaAs and GaAlAs are substantially the same under gas pressure equal to or lower than about $3\times10^{-3}$ Torr and are 0.1 to 0.2 μm/min with a high frequency power of several 100 mW/cm² at 13.56 MHz. If the power density is too low, the self-biasing voltage becomes too low, resulting in carbon comtamination. Therefore, etching is preferably performed with a power density of about 0.2 W/cm² to 1 W/cm². If CCl₂F₂ is used as the etchant gas, the etching rate of GaAlAs will be low at gas pressures higher than about $3\times10^{-3}$ Torr, although the rate for GaAs is high. This is because AlF₃, which is a reaction product, acts as an anti-etching agent. There is no such problem using CCl₄ or Cl₂. The mirror surface is obtained by RIE of the structure from the surface thereof to a level slightly below the active layer.

The threshold current of a semiconductor laser having mirror surfaces formed by the RIE is higher by 20% to 30% than that of a similar semiconductor laser having the mirror surfaces found by the cleavage. However, a lowered threshold current can be compensated for satisfactorily by mirrors constructed as metal surfaces covered with insulating layers. Particularly, the effect of the end faces of a laser structure having insulating layers having a thickness of $(\gamma/2)\cdot(\lambda/n)$ is desirable.

A process of forming the insulating layer by chemical vapor deposition (CVD) will be described. As a matter of fact, it is impossible to use a high temperature process for a compound semiconductor because the vapor pressures of constituent elements thereof are high, and hence lower processing temperatures provide better results. Therefore, CVD with ultraviolet irradiation is preferable. For CVD of SiO₂, a gas containing SiH₄+N₂O can be used as in the input gas. For example, with irradiation with ultraviolet rays of a wavelength of 1,700 Å to 2,000 Å, N₂O is decomposed according to the following raction: N₂O+hv (1,700 to 2,000 Å)→N₂+O ('D). The oxygen thus liberated reacts with SiH₄ resulting in an accumulation of SiO₂. Alternatively, by adding Hg gas to the input gas and irradiating it with ultraviolet rays (2,537 Å) emitted from a low pressure mercury lamp, Hg is excited from the ground state. Hg* in the excited state reacts with the N₂O of the input gas to liberate oxygen therefrom. The latter reacts with SiH₄, resulting in deposition of SiO₂ as follows:

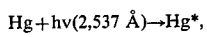

Hg+hv(2,537 Å)→Hg*,

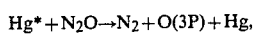

Hg*+N₂O→N₂+O(3P)+Hg, and

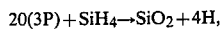

2O(3P)+SiH₄→SiO₂+4H, where O (3P) is oxygen in the ground state. In order to make the mean free path longer, the pressure of the input gas should be reduced to several Torr. The desired reaction proceeds satisfactorily at temperatures from room temperature to 200° C.

As to the Si₃N₄ layer, it is realizable by a reaction between Hg and an input gas containing SiH₄+NH₃ under a reduced pressure at a temperature lower than about 200° C. as follows:

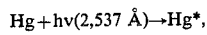

Hg+hv(2,537 Å)→Hg*,

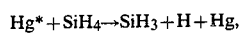

Hg*+SiH₄→SiH₃+H+Hg,

Hg*+NH₃→NH₂+H+Hg, and

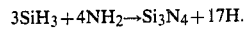

3SiH₃+4NH₂→Si₃N₄+17H.

The deposition rate of Si₃N₄ is about 100 Å/min, and it is possible to precisely control the thickness of the deposited layer. The nature of the layer is improved by heat treating it at about 450° C. for a time period, for instance, 10 to 60 minutes, in an N₂ atmosphere. Deposition of Al₂O₃ and AlN can be realized by CVD using an input gas system of (CH₃)₃Al+N₂O+Hg, AlCl₃+CO₂+H₂, or (CH₃)₃Al+NH₃+Hg using ultraviolet irradiation at a low temperature, similar to the technique described above. Control of the layer thickness can thus be performed very precisely. The lattice spacing and the thermal expansion coefficient of AlN are similar to those of GaAs, and thus AlN is suitable to use with GaAs. CVD with ultraviolet irradiation performed under a reduced pressure can provide substantially uniform deposition even in stepped areas. It is further possible to lower the reaction temperature, even when CVD with plasma is used.

The metal material forming the metal layer which acts as the mirror surface may be various ones depending on the desired oscillation wavelength range. Typical examples of suitable metal materials include Al, Au, Mo, W, Cr, Pt and Cd, etc. It is further possible to vapor deposit these metals on a vertically formed end face of a device in a super high vacuum by slanting the device or to deposit the metal by sputtering. In such a case, since the deposition surface must be cleaned, the degree of vacuum during vapor deposition should be as high as possible. In order to prevent radiation damage from occurring and to improve the form of the layer covering stepped portions, the metal is preferably deposited using CVD. The input used may include halogenides ($WF_6$, $MoF_6$, $CrF_6$, $WCl_6$, $CrCl_6$, etc.), carbonyls ($W(CO)_6$, $Mo(CO)_6$, $Cr(CO)_6$, etc.) and organic metals ($(CH_3)_3Al$, $(CH_3)_2Cd$, etc.). In the case of halogenides, a reduction reaction by $H_2$ is performed, and in the case of organic metals, heat decomposition is performed. It is possible to deposit Mo, W, Cr, Al, etc. by CVD with ultraviolet radiation at low temperatures. That is, the semiconductor laser is etched using RIE to a predetermined length. Then an insulating layer is formed having a desired thickness by CVD with light radiation. Thereafter, the metal layer is formed by CVD with light radiation, etc. It may be effective to provide the metal layer and/or insulating layer in a multilayered structure of different materials.

In FIG. 24A, the laser oscillation occurs in the left-hand portion of the device, although it is derived from the right-hand side waveguide. The coupling coefficient between the portions is determined by the respective refractive indices thereof, the width a of the waveguide and the gap c between the waveguides.

Figure 25:
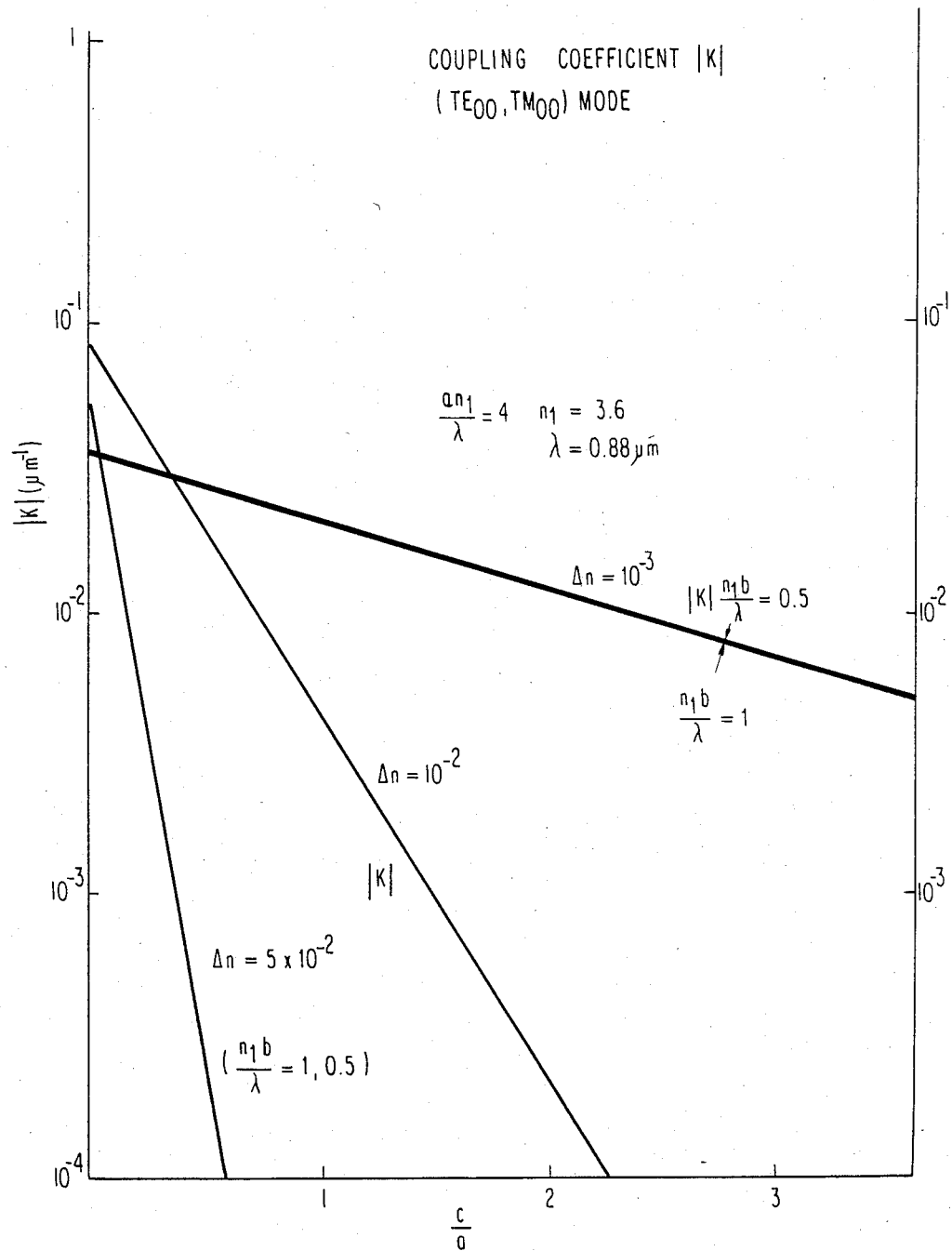
FIG. 25 is a graph illustrating the determination of an optical coupling coefficient.

FIG. 25 shows the relations between the coupling coefficient $|K|$ and a value c/a obtained by normalizing the waveguide gap c with the waveguide width a when the optical waveguides, each having the same parameters as those of the waveguide shown in FIG. 13, are arranged in parallel. In FIG. 25, the ordinate and the abscissa show the coupling coefficient $|K|(\mu m^{-1})$ and the value c/a for cases of $n_1b/\lambda = 0.5$ and 1, under conditions of $\Delta n_2 = 1 \times 10^{-3}$, $1 \times 10^{-2}$ and $5 \times 10^{-2}$, respectively, where $n_1a/\lambda = 4$ and $\Delta n_1 = 5 \times 10^{-2}$. For example, assuming c/a=0.5, where $\Delta n_2 = 1 \times 10^{-2}$, the coupling coefficient $|K| = 0.018$ $\mu m^{-1}$. Practically, with a resonator 10 $\mu m$ long, the proportion of light extracted from the optical resonator and coupled to the waveguide is 0.18, that is, 18% of the total light energy generated can be coupled out into the waveguide. The actual output from the waveguide will of course vary depending upon the width of the optical waveguide, the interwaveguide gap and the difference in refractive indices of the laser oscillation portion and the waveguide portion.

With the invention, it is possible to easily incorporate the semiconductor laser into an integrated circuit and to restrict the increase of the threshold current density inherent to the shortened resonator by using this structure. It should be noted that the structure shown in FIGS. 24A and 24B can be applied to any of the structures shown in FIGS. 18 to 23 as long as light is extracted through an optical coupling between a semiconductor laser whose threshold current is reduced by suitably setting the reflectivity of the end faces of the resonator thereof and the optical waveguide provided in parallel to the diffusion strip of the semiconductor laser. It is also possible to operate the waveguide by applying a forward bias voltage thereto, so that it may function not only as a waveguide, but also as amplifier.

It was described previously that precise forming of a shortened resonator is necessary to make the resonance wavelength coincident with the maximum gain wavelength since the interval of the axial mode is then large. In addition to the necessity for such precise formation, a structure in which a high laser oscillation efficiency is obtained with a fixed oscillation frequency can be obtained by making a structure through which periodic current flows so that current can flow around peaks of the light standing waves.

Figure 26:
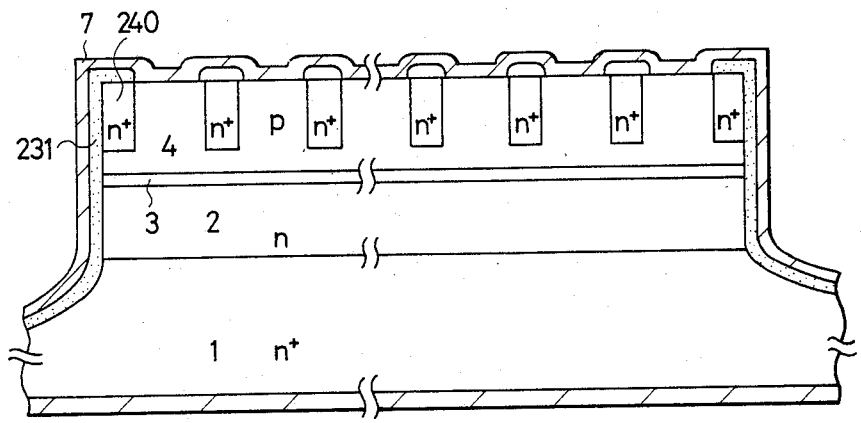
FIG. 26 shows another embodiment of a semiconductor laser including optical coupling.

FIG. 26 shows an embodiment of such a structure, which can be used in place of that shown in FIG. 24B. In FIG. 26, a plurality of regions 240 of the conductivity type opposite that of the region 4 are formed periodically to form a current path which is periodic with a period of $(\gamma/2) \cdot (\lambda/n)$, where $\gamma$, as above, is an integer. In this case, the resonator is formed so that the nodal points of the standing wave coincide with the end faces, and the thickness of the insulating layer 231 corresponds to one-half the oscillation wavelength in the insulating layer. It may be possible to form a gate electrode on the $n^+$ region 240. Alternatively, the region 240 may be a highly resistive region formed by ion implantation of H, He, O, etc. thereinto. This may be applied also to other distributed feedback-type semiconductor lasers as long as the nodal points of the standing wave of light are exactly at the end faces of the resonator. In any case, it is possible to form a high density optical integrated circuit by arranging a number of such semiconductor lasers on a common wafer.

An optical memory, which is a necessary component of an optical integrated circuit, will be described. In order to obtain a memory function, a hysteresis phenomenon is theoretically required. Specifically, hysteresis should occur between the laser output light and the applied voltage or between the laser output light and the injected current.

Figure 27:
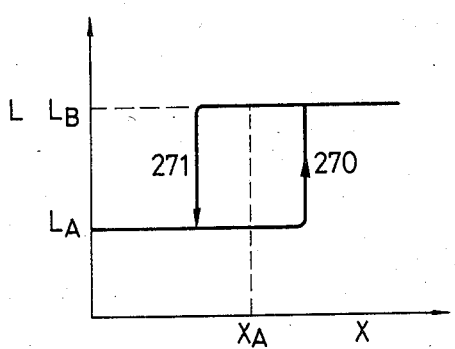
FIGS. 27 to 29 are graphs used to explain the operation of optical memory.

FIG. 27 is a graph used for explaining the hysteresis phenomenon. The abscissa (x) is either voltage or current. When x increases, the light output L increases along a line 270, and when x decreases, the output L decreases along a line 271. For a laser diode having this characteristic, the light output L can be shifted, for example, from an initial output level $L_A$ set by a biasing voltage $X_A$ to $L_B$ by an external input, and vice versa. Thus, it can be used as a memory or a logic function.

The state of a semiconductor laser prior to laser oscillator is considerably different from that after oscillation. That is, when the laser oscillation starts, the carrier lifetime is shortened and the carrier diffusion length is also shortened. In other words, the impedance of the junction portion becomes smaller upon the commencement of laser oscillation, and when the device is driven by fixed voltage, current increases upon commencement of oscillation. However, for a conventional double-hetero laser diode, there may be only one kink in the current-voltage characteristic curve thereof. Therefore, in order to obtain the desired hysteresis, it is necessary to introduce some other structure thereinto. In the conventional semiconductor laser, the carrier and light confinement are performed in the active region, resulting in an improvement of efficiency. In the optical memory according to the present invention, however, light confinement must be rather strictly performed and carrier confinement is changed according to the signal condition. That is, the refractive index of the active layer should be made higher than that of the cladding layer therearound in order to realize satisfactory light confinement, but there no complete carrier confinement can be obtained by potential barriers. Interaction of carriers leaked thereby and the laser light provides hysteresis.

Figure 28:
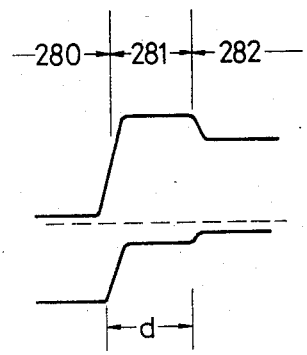

FIG. 28 is an energy diagram of an embodiment of the present invention in which reference numerals 280, 281 and 282 indicate an n-type cladding layer, a p-type laser active layer and a p-type cladding layer, respectively. Differing from the usual laser, the energy gap of the active layer is larger than that of the cladding layer. When a forward bias is applied to a pn junction, electrons are injected from the n-type region 280 to the p-type active layer 281. The diffusion length of electrons can be represented by:

$$L_d = \sqrt{D_e \cdot \tau_{se}},$$

where $D_e$ is the electron diffusion constant and $\tau_{se}$ is the spontaneous lifetime of electrons. Assuming the thickness d of the active layer is smaller than $L_d$, a portion of the electron current may leak from the active layer to the region 282. When the applied voltage is further increased under this condition, the optical gain in the active layer is increased, and when the light intensity reaches a predetermined level, laser oscillation is started. Once laser oscillation starts, the carrier lifetime becomes shortened due to stimulated emission and the diffusion distance is shortened. When only electrons are injected into the active layer as carriers, the lifetime thereof can be approximated by $$\tau_{eff} = \tau_{se}/J_n,$$

where $J_n$ is the normalized current and is equal to $J/J_{th}$ where J is the current density and $J_{th}$ is the threshold current density. Therefore, the diffusion distance $L_d'$ after laser oscillation starts, becomes $$L_d' = \sqrt{D_e \cdot \tau_{eff}} = \frac{L_d}{\sqrt{J_n}}.$$

When $J_n = 2$, then $L_d' = 0.707 L_d$. By making $L_d' < d < L_d$, the carrier diffusion length after the start of the laser oscillation becomes shorter, which is effective in confining the carriers.

The refractive index of the active layer is large enough to confine the light, as mentioned above. Also as previously mentioned, the impedance becomes smaller due to the laser oscillation and the current further increases with a constant voltage drive. Under these conditions, when the applied voltage is increased, the light intensity increases in proportion to the current. However, since the carrier diffusion length $L_d'$ is smaller due to the laser oscillation, carrier and light confinement are performed effectively if the applied voltage is reduced, even to values below the value at which laser oscillation is initiated but which still causes laser oscillation to continue. Further, the decreased impedance and the increased current with constant voltage biasing as mentioned aid in the continuation of the laser oscillation.

Figure 29:
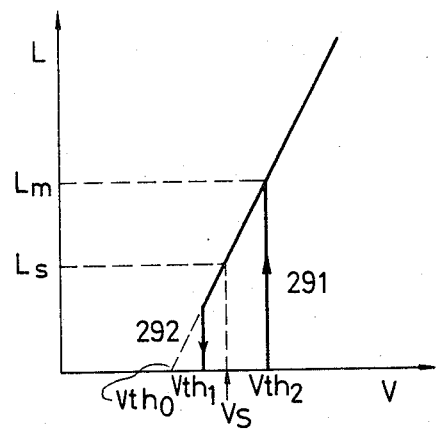

FIG. 29 is an explanatory diagram showing the operation mentioned above in which the abscissa shows the applied voltage and the ordinate the optical output L. When the applied voltage is increased initially, laser oscillation occurs at a voltage $V_{th2}$. From there, the optical output increases along a line 291. When the applied voltage is reduced, the optical output reduces along a line 292, resulting in a hysteresis effect. The factor $J_{th}$ mentioned above relates to a current corresponding to $V_{thO}$ in FIG. 29. In this characteristic curve, the function of the optical memory is obtained by setting a biasing voltage at $V_s$ and externally injecting optical pulses whose intensity is around $L_s$ to start the stimulated emission to thereby continue the laser oscillation and provide an optical output of $L_s$. In order to terminate the laser oscillation, an optical pulse whose energy is equal to or larger than $2L_s$ is injected thereto. That is, due to the stimulated emission caused by such optical pulses, the carrier concentration in the active layer is temporarily reduced abruptly to thereby terminate the laser oscillation. Electrical pulses applied externally may also be effective. However, optical pulsing is preferable in view of high speed logic operations. That is, the above-mentioned memory may act as a so-called bistable circuit element.

It should be noted that in the embodiment of FIG. 28, the active layer is of the p type. Therefore, holes are injected into the region 280, resulting in insufficient hole confinement in the laser active layer, and hence, a low efficiency. In order to improve this defect, it is advisable to provide an active layer of intrinsic type or low concentration of impurity so that injection of electrons and holes into the active layer is effected.

The efficiency may be further improved by making the band gap of the layer 280 larger than that of the layer 281 to eliminate hole leakage. In order to realize the effective recombination of electrons and holes within only the active layer, the regions 280 and 282 are made of indirect-transition type semiconductor material. In so doing, substantially no carrier recombination occurs in the regions 280 and 282, and, accordingly, the diffusion coefficient for these regions is large. Therefore the above-mentioned effects are enhanced.

Figure 30:
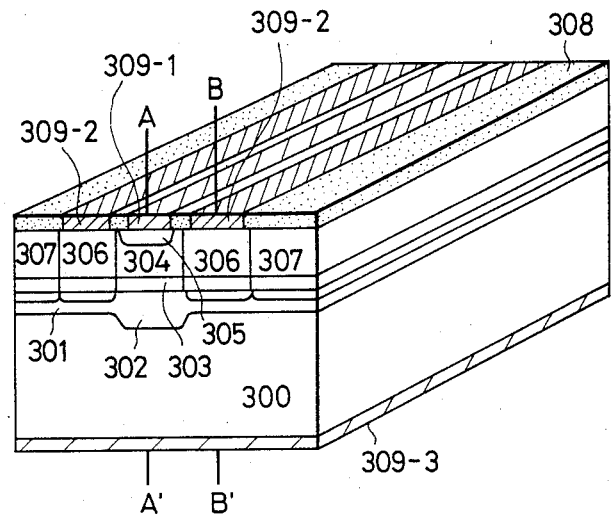
FIG. 30 shows an embodiment of an optical memory.

FIG. 30 shows another embodiment which is suitable for use of a three-terminal type semiconductor laser as an optical memory. On an n+ GaAs substrate 300 is formed a groove strip and an n-type GaAlAs layer 301. A GaAs layer 303 and an n-type GaAlAs layer 304 are expitaxially formed with a protruding portion being formed on the portion 302, the refractive index of which is high, resulting in lateral mode stabilization. Reference numeral 305 depicts a high carrier density n+ region which functions as an emitter, and 306 indicates p+ regions, extending to the regions 301 or 303 and functioning as a base. 307 is a highly resistive region which is formed to restrict current leakage from the bases. The region 303 acts as an active layer which is of p−, p type or i type and whose thickness is about 0.05 to 2 μm.

The thickness of the active layer 303 is very important and is set depending upon active type of the layer (npn or pnp) because the diffusion length depends upon the type of carrier (electron or hole) injected into the active layer. The thickness should be at least less than the diffusion length of the carriers injected from the emitter. The emitters and bases are provided in stripe form to define the optical waveguide direction, and a laser resonator is formed by two reflecting end faces. The regions 305 and 304 act as emitters, the regions 303 and 306 act as bases, and the regions 300, 301 and 302 correspond to collectors. The structure of FIG. 30 is of the npn type. In this structure, the protruding portion 302 may be omitted.

Figure 31A:
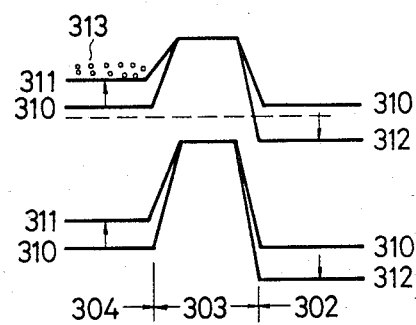
FIG. 31 is a diagram showing energy bands.
Figure 31B:
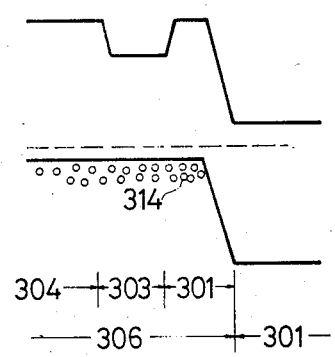

FIGS. 31A and 31B are energy diagrams for the device of FIG. 30 taken in cross section taken along lines A—A' and B—B'. FIG. 31A shows the thermally balanced state by a line 310. The region 303 is the active region. By the application of a forward bias between the emitter and the base, the energy state becomes as shown by a line 311 in FIG. 31A. Thus, electrons are injected from the emitter (304) to the base (303). There may be substantially no hole injection from the base to the emitter because the energy gap of the emitter is larger than that of the base. Therefore, only electrons are effectively injected into the active layer and only electrons which do not recombine in the active layer can flow out to the collector (302).

FIG. 31B is an energy diagram corresponding to the structure along the line B—B' in FIG. 30. As shown therein, holes (314) are injected from this region to the active layer. Although when a positive voltage is applied to the collector, the energy state becomes as shown by a line 312 in FIG. 31A, the current flowing through the collector is substantially constant regardless of the energy state, except when a depletion layer extends up to the emitter causing punch through. The principle on which hysteresis is provided is the same as that described with reference to FIG. 28.

A problem concerning the embodiments of FIGS. 31A and 31B is movement of a portion of the electrons injected from the emitter to the base, which flow mainly to the collector, within the region 306 of the base along the junction plane, since the injection electrons affect the efficiency of the laser adversely. To this end, the carrier concentration of the region 303 should be less than that of the region so that an electron barrier is formed in a junction between the region 306 and the region 303 surrounding the region 306. By so doing, current leakage is minimized and the performance of the laser is improved.

The thickness d of the active layer 303 should be larger than $L_d'$ and smaller than $L_d$.

Although an npn structure has been described, the above is also applicable to a pnp structure in which case the thickness of the active layer is determined by the hole diffusion length.

As other factors in designing the device, the carrier concentration in the activity layer and the thickness thereof should be considered since they both strongly affect the electric characteristics of the optical memory. That is, the width of the depletion layer W at a pn+ stepped junction of a semiconductor can be represented by $$W = \sqrt{2\epsilon_s(V + V_{bi})/qN_A}.$$

For GaAs, for values of $N_A = 10^{14}$ cm$^{-3}$, and $10^{16}$ cm$^{-3}$, the width W is 4.1 μm, 1.3 μm and 0.43 μm, respectively. If the thickness of the active layer is smaller than the width W, it may be punched through even at zero bias. Since the depletion layer of the base region extends from both sides of the emitter and the collector thereto, there is a tendency for it to be easily punched through. In this state, the collector current depends predominantly on the collector voltage, and therefore it is possible to control the height of the potential barrier in the base by the collector voltage, and thus it is possible to control the collector current by the voltage applied to the base and the collector voltage. With a zero bias voltage applied to the collector, there is no punchthrough. However, it is possible to control the collector current by the collector voltage after punch through occurs by applying a reverse bias voltage. When the height of the barrier against electrons in the base can be controlled by the collector voltage, the collector current exhibits a nonsaturation characteristic with respect to the collector voltage.

Figure 32:
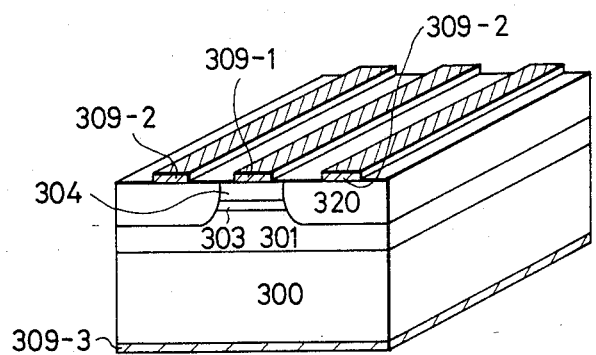
FIGS. 32 to 34 show further respective embodiments of an optical memory.

FIG. 32 shows another embodiment in which a buried hetero structure is used. Here, reference numeral 320 depicts a p-type GaAlAs layer.

Figure 33:
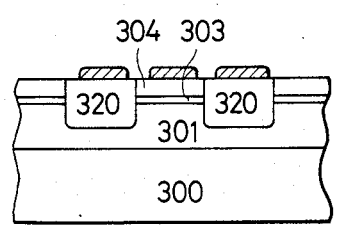
Figure 34:
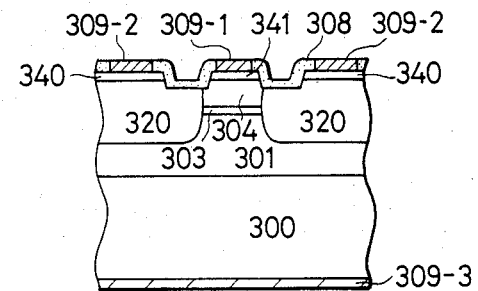

In another embodiment shown in FIG. 33, the region 320 is formed in two portions. In a further embodiment in FIG. 34, an n+-type GaAs layer 341 and a p+-type GaAs layer 340 are added thereto to reduce the ohmic resistance and an electrode separation is introduced between the base and the emitter. It should be noted that other structures such as a buried crescent (BC) structure, or plano-convex waveguide (PCW) structure may be used for the same purpose.

Figure 35:
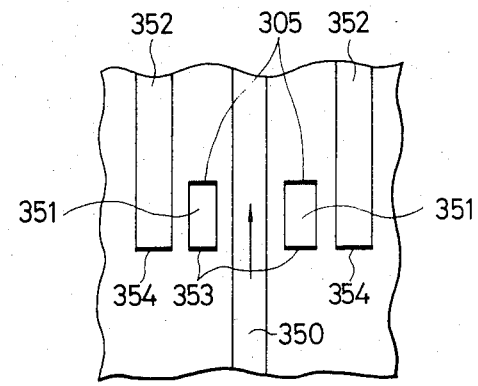

FIG. 35 shows the top view of another embodiment, which is a logic current. Reference numeral 351 depicts two semiconductor lasers each associated with optical waveguides 350 and 352. Reflection surfaces 353, 305 and 354 are formed by insulating layers and metal films, the reflectivity thereof being substantially 100%. The semiconductor laser 351 may be any of those shown in FIGS. 30, 32, 33 and 34 which operate in the bistable mode. The optical waveguide 350, for example, functions as an input waveguide and the two waveguides 352 as output waveguides, thus forming an inverter having one input and two outputs.

It is possible to further increase the number of outputs by forming laser elements around the waveguide 350. That is, it is possible to increase the fan-out of the device. Further, it is possible to use the output from 352 as an input to a subsequent logic circuit. If it is desired to provide bidirectional outputs from the laser 351, the optical waveguides 352 may be extended parallel to the waveguide 350 without providing the reflection surfaces 354. Further, the waveguides 350 and 352 can function as not only mere passive optical waveguides, but also as amplifiers by applying constant current biasing. This optical coupling system is similar to FIG. 24.

Since these logic circuits are of the planar type, the manufacturing processes therefor and interconnections therebetween are facilitated when devices are fabricated as parts of an integrated circuit. Further, the elements and/or circuits mentioned hereinbefore have no disadvantages of the reflection of light and feedback of light resulting from the discontinuous plane in the optical waveguide, and high threshold current due to low reflectivity of the end faces. All of these features are inherent to a conventional laser element in which the laser output is extracted from an end face.

Next, high-speed modulation of light using the invention will be described. In the conventional modulation system in which an applied voltage or current is directly modulated, the maximum frequency of modulation depends upon the lifetime of the injected carriers and photons and is limited to around 10 GHz at the most.

On the other hand, the frequency limit of modulation may be effectively removed by an optical wave modulation system utilization an optical resonator. The reasons for this will be explained with reference to a Fabrey-Perot type optical resonator.

Figure 36:
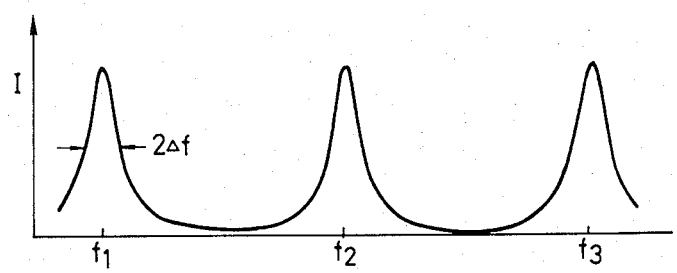
FIG. 36 shows an example of a resonance characteristic of a fabry Perot resonator.

FIG. 36 shows typical characteristics of such a resonator. The resonator has resonance frequencies $f_1$, $f_2$, $f_3$, etc. The half width at half maximum at each resonance frequency is indicated by $\Delta f$. The resonance wavelength can be represented, using a plane wave approximation, by:

$$2L_d = (\lambda_1/n_{\lambda 1}) \cdot m, \quad (4)$$

and $$2L_d = (\lambda_2/n_{\lambda 2})(n_1 + 1), \quad (5)$$

where $L_d$ is the length of the laser resonator, $n_{\lambda 1}$ and $n_{\lambda 2}$ are refractive indices, m is an integer and $\lambda_1$ and $\lambda_2$ are resonance wavelengths. The resonance wavelength is determined by the number of standing waves within the resonator. The resonance frequency can be determined by the relations of $$f_{1,2} = C/\lambda_{1,2}.$$

That is:

$$f_1 = (C/2L_d n_{\lambda 1})m, \quad (6)$$

and $$f_2 = (C/2L_d n_{\lambda 2})(m+1). \quad (7)$$

These are referred to as the axial mode. A frequency difference $\Delta f_l$ between the axial modes is represented as follows:

$$\Delta f_l = f_2 - f_1 = \left(\frac{C}{2L_d}\right)\left(\frac{m+1}{n_{\lambda 2}} - \frac{m}{n_{\lambda 1}}\right). \quad (8)$$

Assuming $n_{\lambda 1} \cong n_{\lambda 2}$, then:

$$\Delta f_l = (C/2L_d) \cdot (1/n_\lambda) \quad (9)$$

The half width at half maximum is then represented by:

$$\Delta f = \frac{C}{2\pi n L_d} \sin^{-1}\left(\frac{1-R}{2\sqrt{R}}\right), \quad (10)$$

where R is the power reflection coefficient at the end face.

As will be clear by considering ordinary amplitude modulation of electromagnetic waves, when a wave whose frequency is $f_0$ is modulated at a modulation frequency $f_m$, the modulated wave includes frequency components of $f_0$ and $f_0 \pm f_m$. At least one frequency within the range of $f_0 \pm f_m$ should be passed through, otherwise it is impossible to transmit the modulation wave. That is, due to the characteristics of the optical resonator, modulation of laser light is impossible unless the modulation frequency $f_m$ substantially corresponds to the frequency interval $\Delta f_l$ between the axial modes or the frequency $f_m$ is smaller than the half width at half maximum frequency $\Delta f$ within one of the axial modes.

The quality factor Q is usually used as a criteria in judging the performance of the optical resonator. Q can be written as follows:

$$Q = \omega \cdot \text{(field energy stored in the resonator)/(power dissipated from the resonator)}, \quad (11)$$

where $\omega$ is the angular frequency. Alternatively, Q can be approximated by:

$$Q = f/2\Delta f. \quad (12)$$

In the case where the resonator is of the Fabrey-Perot type and the losses therein are due mainly to the transmission of the mirrors, Q can be represented by:

$$Q = \omega n L_d / C(1 - R). \quad (13)$$

Representing $\Delta f_l$ and $\Delta f$ using the expression for Q, $$\Delta f_l = \frac{\pi f}{(1-R)} \cdot \frac{1}{Q} \quad \text{and} \quad (14)$$

$$\Delta f = \frac{f}{1-R} \cdot \frac{1}{Q} \sin^{-1}\left(\frac{1-R}{2\sqrt{R}}\right). \quad (15)$$

From these equations, it is clear that the smaller the Q, the higher the achievable frequency of modulation. In order to make the Q of the semiconductor laser small, it is advisable to use a short cavity laser having a small $L_d$ or to make R as near to zero as possible.

Figure 37:
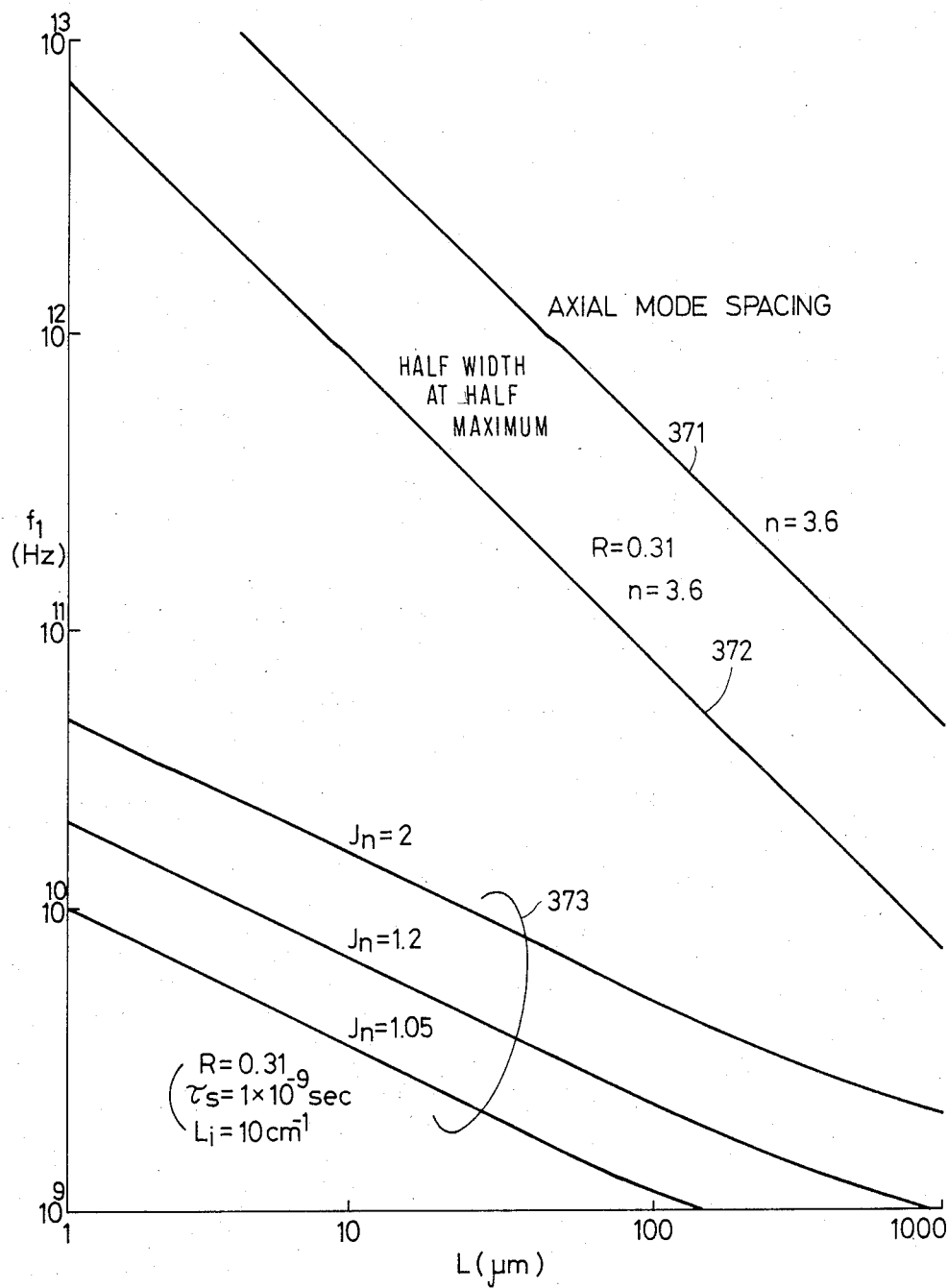
FIG. 37 is a graph showing a upper limit of modulation frequency.

FIG. 37 shows the frequency limits of modulation by a semiconductor laser belonging to GaAs-GaAlAs group and having a resonator length L for various modes of modulations. In FIG. 37, line 371 indicates a modulation frequency when a light is modulated corresponding to the axial mode spacing. Line 372 shows the maximum modulation frequency corresponding to the half width at half maximum of the axial mode, and lines 373 show resonance frequencies for ordinary direct modulation with current, where $J_n$ is a current density normalized with respect to the threshold current density, the refractive index n is 3.6, the reflectivity R is 0.31, the mean carrier lifetime $\tau_s$ is $1 \times 10^{-9}$ sec and the absorption coefficient $\alpha_i = 10$ cm$^{-1}$. The higher the value of $J_n$, the higher the frequency of modulation. In the case of direct modulation, the modulation limit is about 20 GHz even when L = 10 μm. It may be possible to modulate with a current whose frequency corresponds to axial mode spacing by using either a long laser diode or using an external resonator. However, the latter method is not preferable if the device is to be provided in integrated circuit form. By utilizing the interaction of light with an aid of carriers in the laser medium and the half width at half maximum frequency range of resonant characteristics for the short cavity semiconductor laser, a higher frequency of modulation becomes possible using a short cavity semiconductor laser and the resulting device is suitable for use in an optical integrated circuit.

Figure 38:
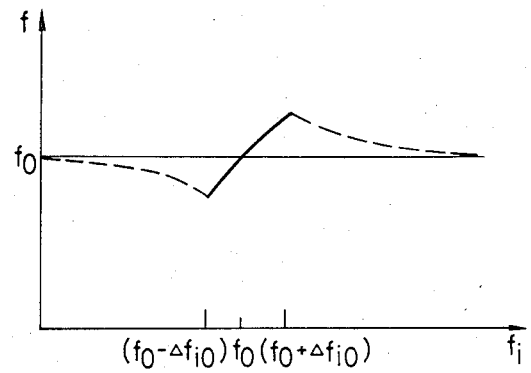
FIGS. 38 and 39 are graphs used to explain light-to-light interaction.

Describing the light-to-light interaction, no interaction occurs when light signals cross paths in air. Although nonlinearity of the magnetic permeability or dielectric constant of most ordinary materials does not effect a strong interaction, the effect of light-to-light interaction in a laser medium having therein a population inversion of carriers is considerable. That is, if a laser amplifying medium lasing at a single frequency $f_0$ is irradiated with a laser light of frequency $f_i(=f_0+\alpha f_i)$, the light signals will strongly interact through the inverted carriers in the laser medium. FIG. 38 shows the variation of lasing frequency f when light of frequency $f_i$ is externally injected into a laser oscillating at frequency $f_0$.

The lasing oscillation may synchronize with the externally supplied light if the difference $\Delta f_{i0}$ in frequency is as follows:

$$\Delta f_{i0} = |f_0 - f_i| < \frac{f_0|S_i|}{2Q|S|}, \quad (16)$$

where Q is the quality factor of the resonator, $|S_i|$ is the amplitude of the external light and $|S|$ is the amplitude of the oscillation. This synchronization is referred to as resonance. Outside the conditions of inequality (16), frequency and amplitude modulation (nonresonance) occurs, and the laser oscillation under nonresonance condition includes various spectral components. The frequency of the largest components among these is as shown by broken lines in FIG. 38. Therefore, the frequency range for which effective amplitude modulation is possble is determined by the following equation derived from equation (10) and inequality (16):

$$\frac{f_0|S_i|}{2Q|S|} < \Delta f < \frac{C}{2\pi n L_d} \sin^{-1}\left(\frac{1-R}{2\sqrt{R}}\right) \quad (17)$$

Using equation (13), equation (17) can be rewritten as follows:

$$\frac{C(1-R)|S_i|}{4\pi n L_d|S|} < \Delta f < \frac{C}{2\pi n L_d} \sin^{-1}\left(\frac{1-R}{2\sqrt{R}}\right) \quad (18)$$

Assuming a GaAs laser, if $$|S_i|/|S| = 10^{-2}$$

and $L_d = 100$ μm, the inequality (18) becomes $4.6 \times 10^8$ Hz $< \Delta f < 8.86 \times 10^{10}$ Hz. For $L_d = 10$ μm, it becomes $4.6 \times 10^9$ Hz $< \Delta f < 8.86 \times 10^{11}$ Hz.

For the case of nonresonance, the oscillation includes, in general, frequency components $nf + mf_i$, when n and m are positive or negative integers. Among these components, which are referred to as coupling harmonics, $2f - f_i$ and $2f_i - f$ are closer to $f_0$. Therefore, assuming $f_i > f$, the oscillator spectrum includes components of ..., $2f - f_i$, f, $f_i$, $2f_i - f$, ... where f varies around $f_0$ as shown in FIG. 38.

Figure 39:
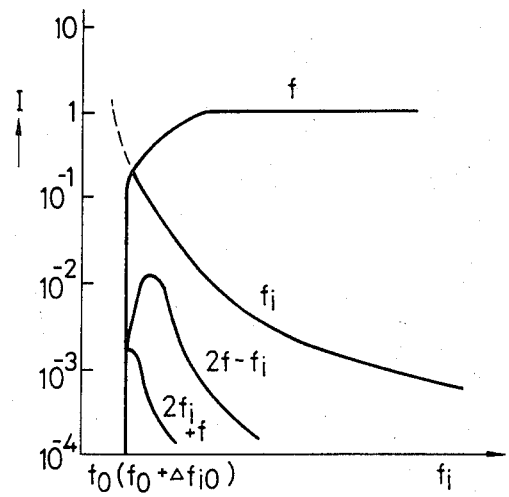

FIG. 39 shows variations of the nonresonance power spectrum as a function of $f_i$. From FIG. 39, it is clear that, in the resonance region, the oscillation frequency is $f_i$, and in the nonresonance region, it is mainly f, producing sidebands of $f_i = f + \alpha f$ and $2f - f_i = f - \Delta f$, which result in amplitude modulation with the laser light as in the case of the electromagnetic waves. It is also clear that when the deviation of the frequency of the external light from $f_0$ is too large, the efficiency is degraded. Therefore, there is a range of preferred operating conditions. In this case, an upper limit of the modulation frequency for a laser belonging to the GaAs and GaAlAs group is shown by the line 372 in FIG. 37. However, because the upper limit is determined by that of the resonator and the electron-to-electron relaxation time of the carriers which assist the light-to-light interaction, which is on the order of $10^{-12}$ sec, it is impossible to realize a modulation frequency of $10^{12}$ Hz. That is, the upper limit of the modulation frequency of a laser having a resonator of length 10 μm or shorter is effectively determined by the electron-to-electron relaxation time.

In the light-to-light interaction mentioned above, the interaction between f and $f_i$ occurs in the range of half width at half maximum frequency at one of the axial modes of the resonator. There is another important light-to-light interaction corresponding to the axial spacing frequency of the resonator, namely, an interaction between $f_1$ and $f_2$, as shown in FIG. 36. In a laser which can oscillate in two axial modes, a portion of the inverted carrier distribution is commonly coupled with an electromagnetic field in these modes, and thus an interaction occurs between the axial modes.

The inversion distribution includes a component which is independent of time and a component which oscillates at a frequency determined by a difference between two oscillation frequencies, the latter being referred to as the origin of the oscillating variation. The variation is a pulsation of the inversion distribution. This pulsation signal provides an effect similar to that of coupling harmonics, and thus not only modes of $f_1$ and $f_2$ but also coupling harmonic modes of $2f_1 - f_2$, $2f_2 - f_1$, etc. are present. If the axial modes corresponding to the coupling harmonics made have enough gain, they interact with these coupling harmonic modes to generate laser oscillations in multiple modes as mentioned previously. The intervals between the oscillation frequencies are equal, and the output light contains pulsations with a time interval corresponding to the axial mode spacing. This is referred to as mode synchronization. However, mode synchronization does not usually occur unless synchronization is forced externally at a frequency corresponding to the interval of lasing frequencies.

In general, by injecting laser light with frequency $f_2$ into a laser which has been emitting laser light with, for example, frequency $f_1$, carriers are consumed by the laser light with frequency $f_2$ and the laser oscillation at $f_1$ is quenched due to intermode competition. Due to this intermode competition, the semiconductor laser oscillates in the mode of the injected laser light, although the situation may depend on the degree of the intermode coupling. Therefore, when a light-to-light interaction is to be utilized, it is preferable to use amplitude modulation within the half width at half maximum of one axial mode than to use the interaction between the axial modes.

Figure 40A:
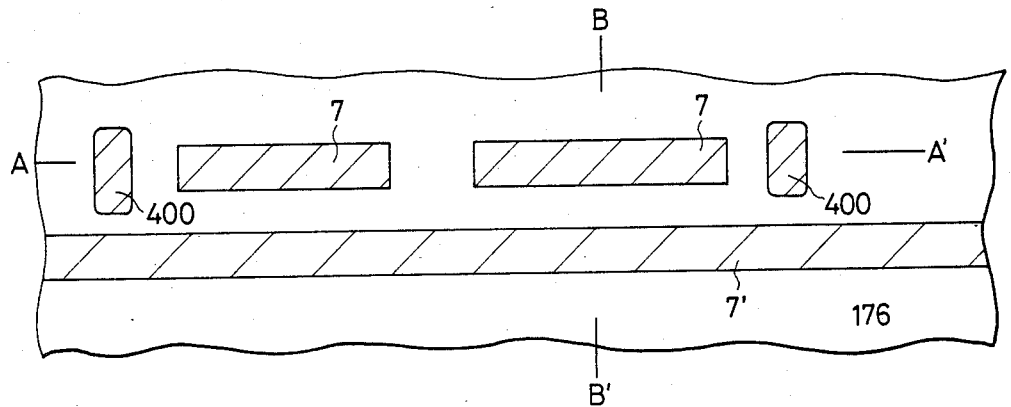
FIGS. 40 and 41A to 41C are cross-sectional views of embodiments employing light-to-light interaction for modulation.
Figure 40B:
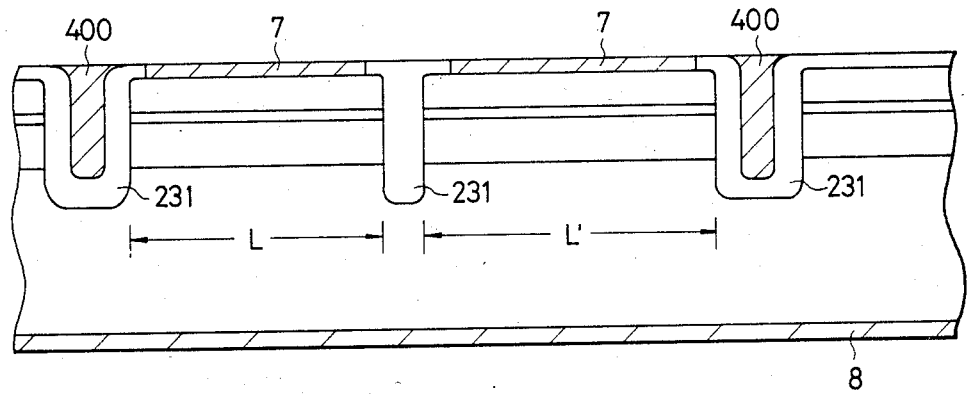
Figure 40C:
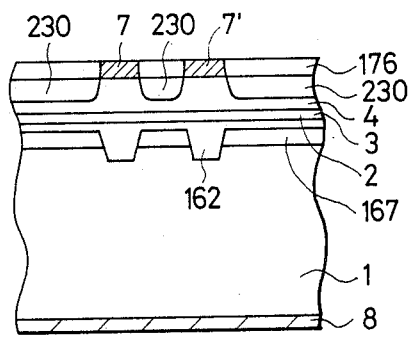

FIG. 40A is a plan view of an embodiment in which amplitude modulation due to light-to-light interaction is performed, and FIGS. 40B and 40C are cross-sectional views taken along lines A—A' and B—B', respectively, in FIG. 40A. The device of this embodiment is constituted by a pair of lasers having resonators whose lengths are L and L' and an optical waveguide optically coupling these lasers. These two lasers emit laser light at different frequencies, and an interaction between the laser lights is intended.

As mentioned previously, when a short resonator is used, the axial mode spacing is large, and therefore the number of axial modes within a frequency range for which there is a gain expected is small. Consequently, it is necessary to make the frequency of resonance peaks of a short resonator coincident with the frequency at which the gain becomes a maximum.

In the device of FIGS. 40A to 40C, insulating layers 231 and a metal portion 400, provided for increasing the reflectivity, are completely buried to make the wafer surface flat. In order to establish the frequencies of the two lasers, it is advisable, in addition to the regulation of the resonators themselves, to introduce a structure of the type shown in FIG. 26, or to use a distributed feedback type laser instead of the laser shown in FIGS. 40A to 40C. In the latter case, the Q of the resonator may be different from that of the Fabrey-Perot type resonator. In FIGS. 40A to 40C, the insulating layer 231, which couples the two lasers optically, can be made of $SiO_2$, $AlO_3$, $Si_3N_4$, GaN or AlN, etc. It should be noted that, in addition to such insulating layer, it is possible to use a semiconductor layer and/or metal layer in between. Further, it is advisable to make the light reflection coefficient of that portion large to thereby lower the threshold current of the laser.

Figure 41A:
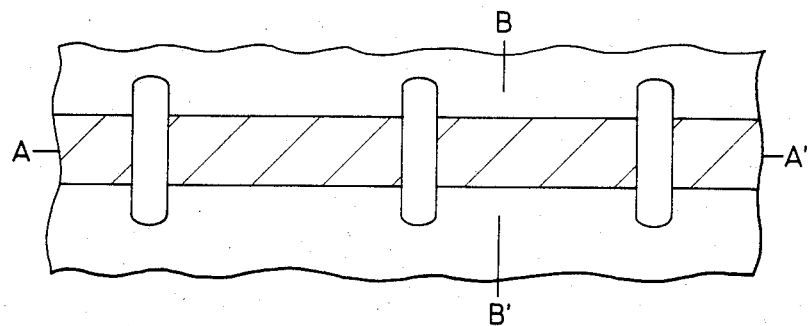
Figure 41B:
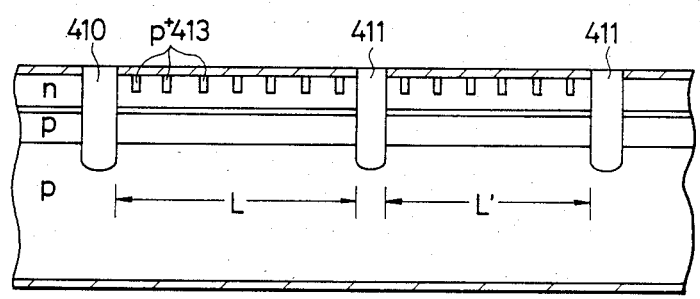
Figure 41C:
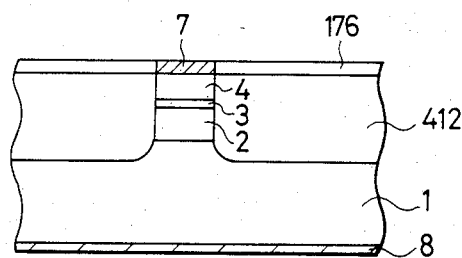

FIGS. 41A to 41C show another embodiment in which two laser diodes are formed within an optical waveguide. Reflecting portions 410 and 411 are formed at end faces of the lasers. These are made of any of various materials such as dielectric material or dielectric material combined with metal on semiconductor materials. A layer 412 is constructed of a material whose refractive index is smaller than that of the active layer (optical waveguide). Reference numeral 413 indicates a portion whose conductivity type is opposite that of the region 4 or whose resistance is high. By supplying a current to the portion periodically, the structure oscillates at a single frequency. It is possible to obtain an amplitude modulated output by making the period of these lasers slightly different. Although the output is bidirectional in these devices, it may be unidirectional. In the latter case the reflecting portion 410 should be made of a material capable of completely reflecting light. By closing one end of the waveguide in the device of FIGS. 40A to 40C, a similar effect can be expected. Semiconductor laser structures other than those mentioned above may be used as well.

Figure 42:
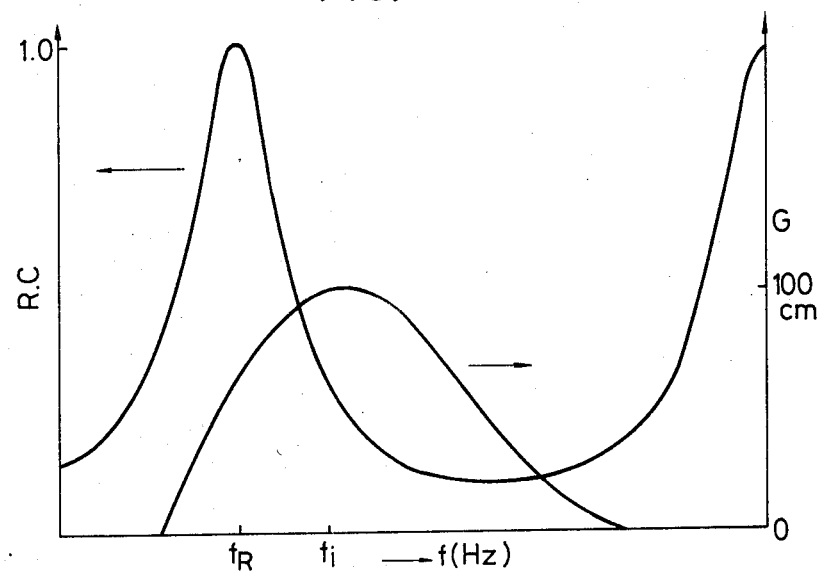
FIG. 42 is a graph used to explain another light-to-light modulation technique.

Instead of an interaction between light signals from two different semiconductor lasers, it is possible to realize amplitude modulation by using one laser and one resonator having gain. If a resonator having gain is shortened, the mirror losses increase, and little laser oscillation output is obtained even if light gain exists. The short resonator is made to have a maximum gain at a frequency different from the resonance frequency $f_R$ of the short resonator as shown in FIG. 42. Under this condition, when the light whose frequency is $f_i$ is externally injecting into the short resonator, the light output is modulated with a period corresponding to $f_i-f_R$. That is, if the frequency $f_i$ is coincident with the resonance frequency $f_R$, the electromagnetic waves in the resonator are in phase and intensified. However, if $f_i$ is slightly different from $f_R$ ($f_i=f_R+\Delta f$), an amplitude of composite waves (obtained when a first wave and a wave reflected at the end faces of the resonator overlap each other) is slightly smaller than the sum of the amplitudes because the phase of the reflected wave is slightly different from that of the first wave. A phase shift of the wave in the resonator is increased due to such reflections at the end faces. When the phase is shifted 180° by this multiple reflection, the electromagnetic field intensities of the two waves cancel each other, and therefore the stimulated emission is abruptly weakened. The time period $\Delta t$ during which the stimulated emission is weakened can be represented by:

$$\Delta t = 2mL_dn/c,$$

and the frequency approximated by $\Delta f=1/2\Delta t$. That is, the output laser light pulsates with a repetition period of $2\Delta t$. In FIG. 42, $\Delta f=f_i-f_R$, which is the amplitude modulation frequency.

Figure 43A:
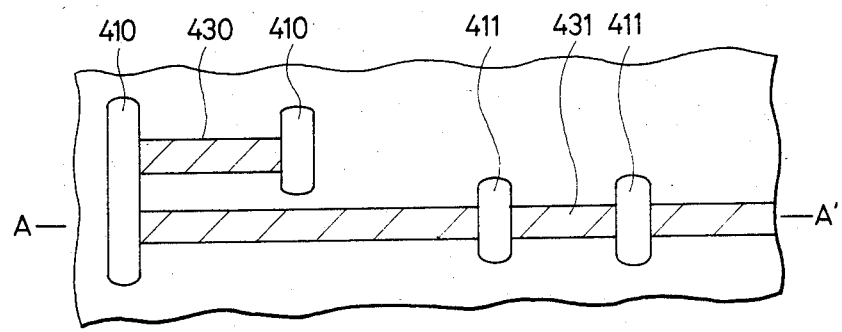
FIGS. 43 and 44 are diagrams used to explain an optical waveguide mode.
Figure 43B:
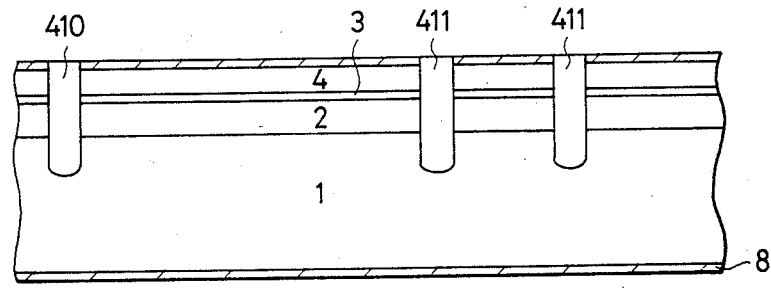

FIGS. 43A and 43B, show an embodiment realizing the above-mentioned modulation, The former is a plan view of the embodiment. The latter is a cross section taken along a line A—A' in the former. In this figure, this system is composed of a laser light-emitting portion 430 and a modulator 431. At both ends of the light-emitting portion 430, high reflectivity portions 410 are provided. Also, the modulator 431 has low reflectivity portions 411 at opposite ends thereof. The modulator 431 in the waveguide can be formed variously as in the embodiments mentioned previously.

Although semiconductor lasers employing a short resonator and the narrow stripes, optical memory, logic circuit and modulation system have been previously described, another important aspect of the present invention is optical coupling between light-emitting elements and/or between a light-emitting element and a waveguide. As mentioned with reference to FIG. 25, the coupling coefficient obtainable by arranging optical waveguides close to each other is very small. Thus, the behavior of light in the waveguide mode will first be discussed, and then optical coupling will be further considered.

Figure 44:
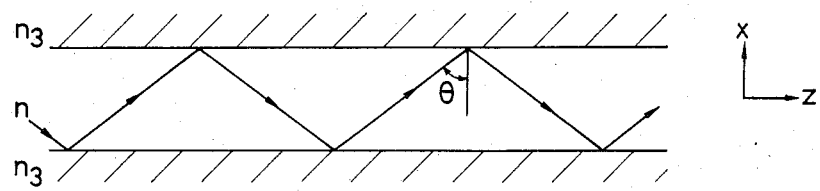

Viewing the optical waveguide of FIG. 13 in the x-z plane, the locus of the light waves in the waveguide is along a zigzag path due to reflections as shown in FIG. 44. This is also true in the y-z plane. Such propagation or guiding of light in the waveguide is referred to as a zigzag-ray model. The wave vector $k_1$ is represented by:

$$k_1^2 = k_x^2 + k_y^2 + k_z^2. \qquad (19)$$

The waves propagate in the x-z plane at a reflection angle $\theta$ represented by:

$$\tan \theta = k_z/k_x. \qquad (20)$$

Figure 45:
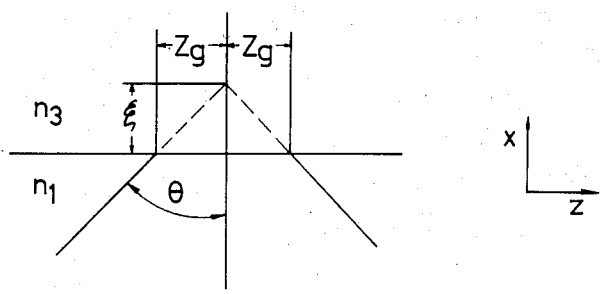
FIGS. 45, 46 and 47 are graphs showing specific calculation examples.

Strictly speaking, reflections at interfaces between materials whose refractive indices are $n_1$ and $n_3$ occur after light has penetrated the material having the refractive index $n_3$ by a distance $\xi$, as if the interface were shifted into the material of $n_3$ by the distance $\xi$ as shown in FIG. 45. This phenomenon is referred to as a Goos-Haechen shift.

Figure 46:
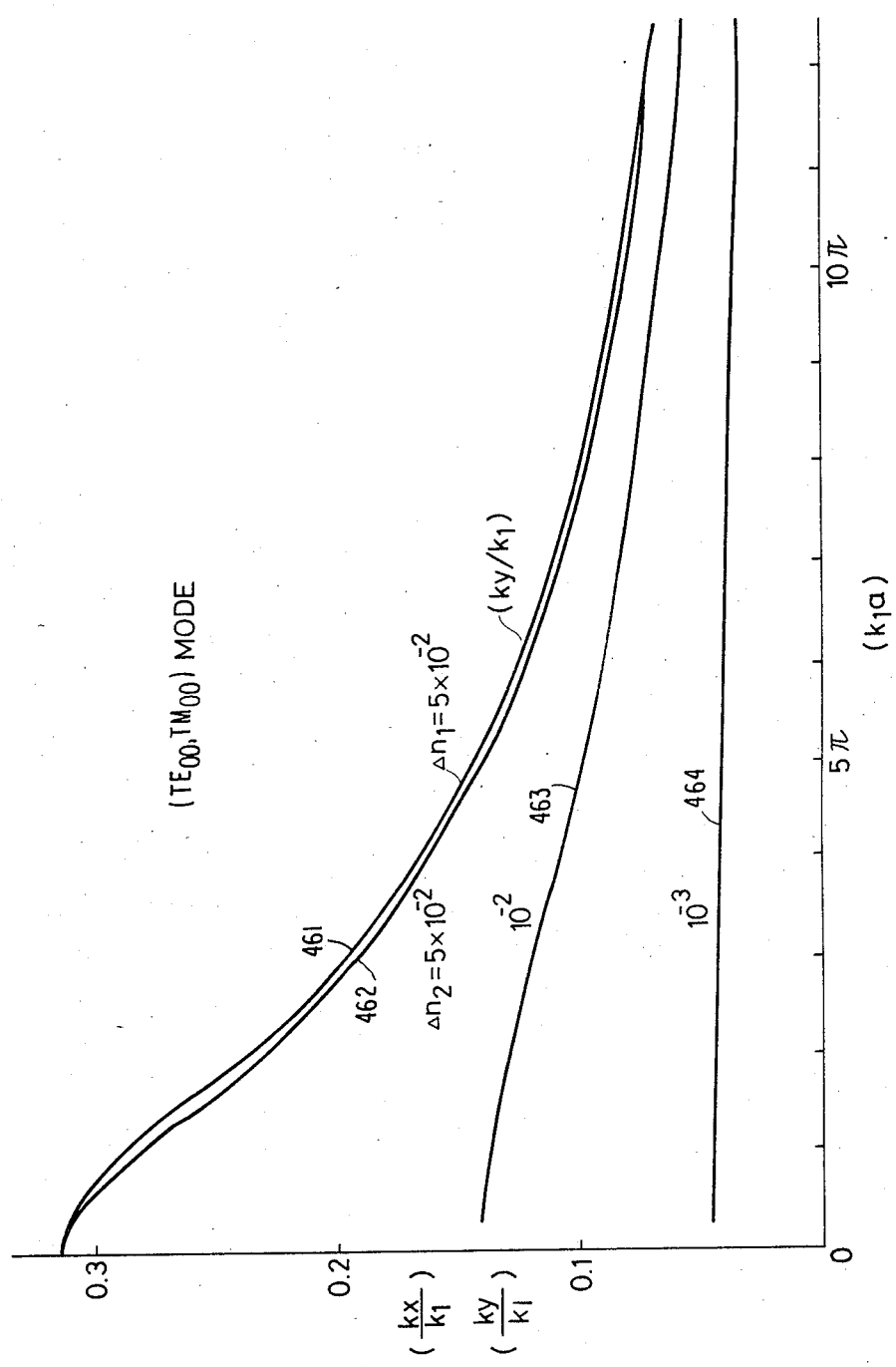

FIG. 46 is a plot of calculated values of $$k_x/k_1$$

and $$k_y/y_1$$

against the width ($k_1a$) of a waveguide formed of GaAs material, particularly, of the GaAlAs group, in which $$n_1b/\lambda = 0.5.$$

In FIG. 46, a line 461 indicates the value of when $\Delta n_1 = 5 \times 10^{-2}$, and lines 462, 463 and 464 the values of $$k_x/k_1$$

for $\Delta n_1 = 5 \times 10^{-2}$, $1 \times 10^{-2}$ and $1 \times 10^{-3}$, respectively, where $\Delta n_1 = 5 \times 10^{-2}$. The quantity $k_y/k_1$ is nearly equal to $k_x/k_1$ for $\Delta n$ in the range of $1 \times 10^{-2}$ to $1 \times 10^{-3}$.

Figure 47:
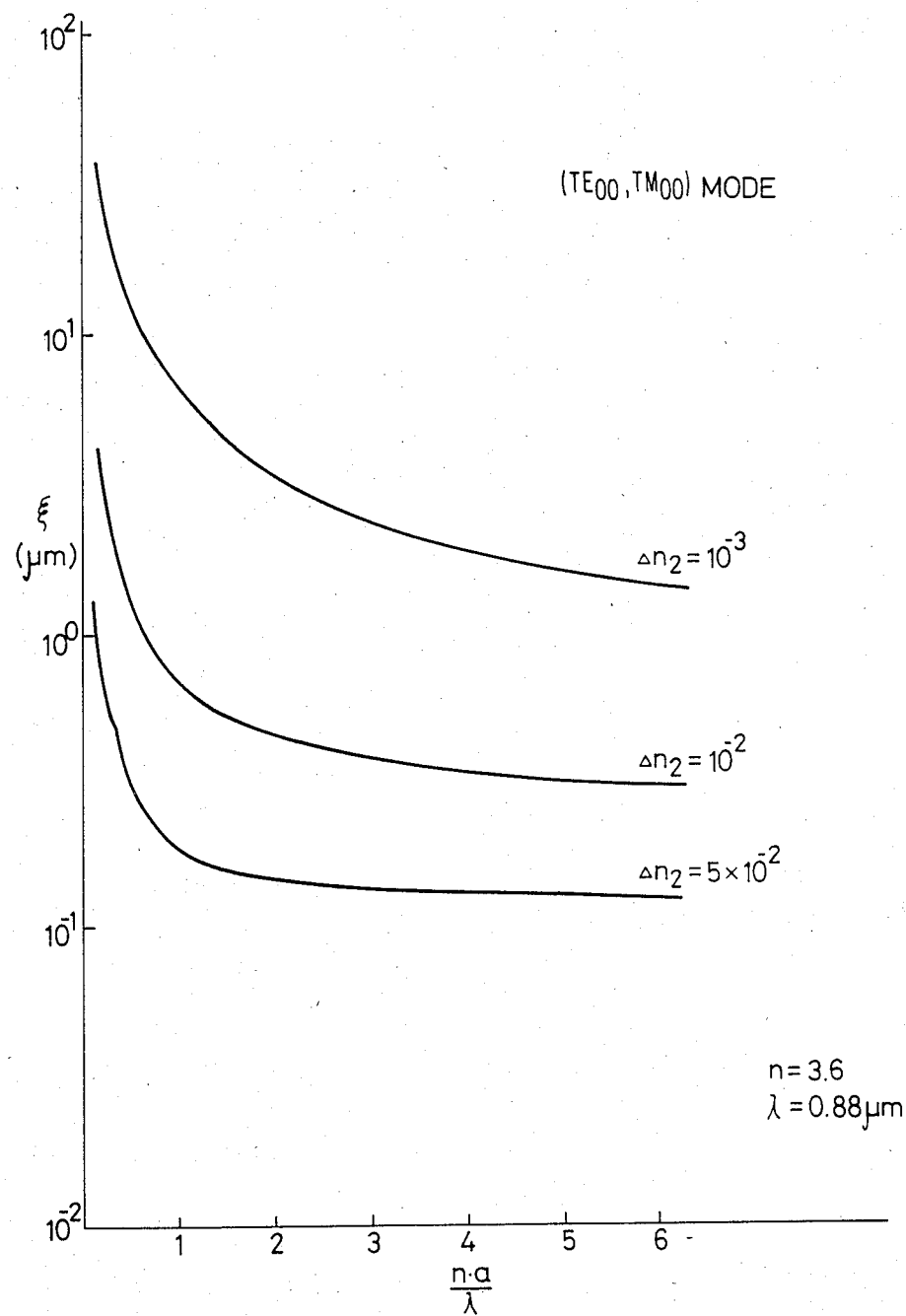

FIG. 47 shows variations of the penetration length of the guided wave $\xi$ in the x direction for $\Delta n_2 = 5 \times 10^{-2}$, $1 \times 10^{-2}$ and $1 \times 10^{-3}$, as a function of $$n_1 a/\lambda,$$

where $\Delta n_1 = 5 \times 10^{-2}$ and $$n_1 b/\lambda = 0.5.$$

For an optical waveguide wider than $$n_1 a/\lambda = 2,$$

the distance $\xi$ is substantially saturated. Assuming $n_1 = 3.6$ and $\lambda = 0.88$ $\mu$m, it is possible to narrow the optical waveguide up to $a \geq 0.49$ $\mu$m. The light intensity at this distance $\xi$ from the border of the waveguide, is reduced by a factor of $1/e = 0.368$ from the light intensity at the waveguide border. For example, for $$n_1 b/\lambda = 0.5,$$

$$n_1 a/\lambda = 4,$$

$\Delta n_1 = 5 \times 10^{-2}$ and $\Delta n_2 = 10^{-2}$, then $\theta = 85.2°$ and $\xi = 0.3$ $\mu$m.

Figure 48A:
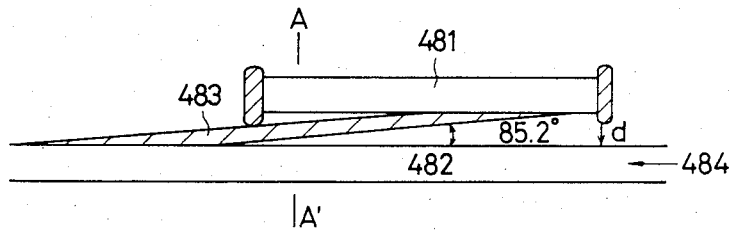
FIGS. 48 to 51 show various embodiments including optical connections between a semiconductor laser and an optical waveguide.
Figure 48B:
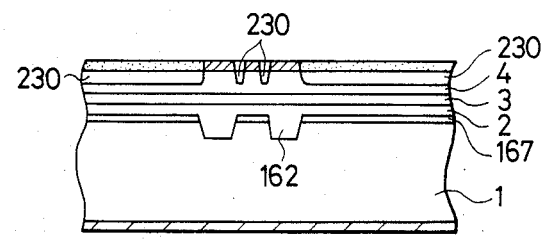

FIGS. 48A and 48B, show an embodiment employing coupled waveguides the former being a plane view and the latter being a cross-sectional view taken along a line A—A' in FIG. 48A. In FIGS. 48A and 48B, a laser light-emitting portion 481 is optically coupled to an optical waveguide 482 by an optical coupling portion 483, the inclination angle thereof being set at about 85.2° (taking the above discussion into consideration), so that the laser light from the portion 481 can be picked up by the optical coupling portion 483. In this embodiment, the optical coupling can be on-off switched by an electrode provided on the portion 483.

When no current is applied, the coupling between the laser portion 481 and the waveguide 482 is determined by the space d therebetween. When the space d is 1 $\mu$m, for example, the optical coupling is about 3%. However, the coupling can be improved to several tens of percent by supplying a current through the current portion 483. The amplification or less of the region 483 varies with the bias current on the region 483, and hence the optical coupling coefficient can be easily changed arbitrarily. Further, with the structure shown in FIGS. 48A and 48B, for example, an optical signal propagating in the direction of an arrow 484 does not affect the laser portion 481. An optical signal propagating in the opposite direction may enter the laser portion 481 easily. That is, the structure may function as a unidirectional coupler. The coupling also depends upon the inclination angle and the width of the optical coupling portion.

Figure 49:
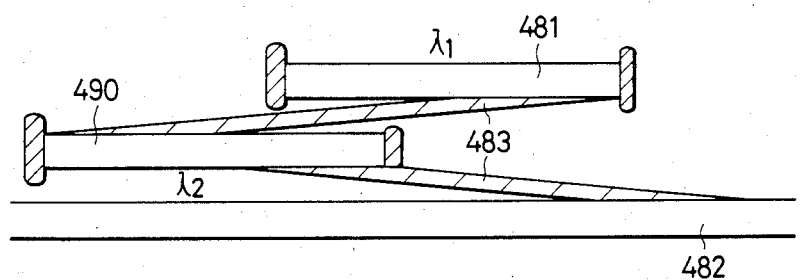

FIG. 49 shows another embodiment of the present invention in which a region 490 operating as an amplifier or a laser is further provided between the laser portion 481 and the waveguide 482. Assuming that the oscillation wavelength $\lambda_1$ of the laser portion 481, is equal to the amplifying wavelength $\lambda_2$ of the amplifier 490, this amplifier 490 can amplify the laser light from the laser portion 481, but block the light with all other wavelengths from the waveguide 482. The amplifier 490 operates as a selective filter. The amplifier 490 may have either the structure shown in FIG. 26 or a distributed feedback structure, for example. Further, by changing the biasing to the amplifier 490, the optical coupling between the laser portion 481 and the waveguide 482 can be on-off switched arbitrarily. Moreover, in the case of using the portion 490 as a laser, by making $\Delta\lambda = |\lambda_1 - \lambda_2|$ to cause a light-to-light interaction to occur between the laser portions 480 and 490, it becomes possible to produce a high repetition rate pulsed signal.

Figure 50:
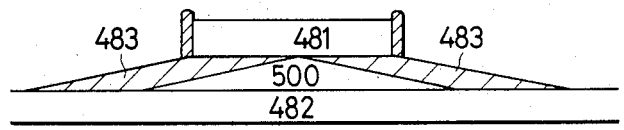
Figure 51:
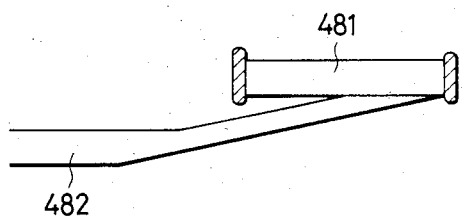

FIG. 50 shows an embodiment in which a pair of optical coupling portions 483 are arranged in opposite directions so that an optical output can be derived bidirectionally. In this case, a region 500 surrounded by the coupling portions 483 and the waveguide 482 may be used as a coupling region. FIG. 51 depicts an embodiment in which the light output from the laser portion is unidirectional.

As mentioned hereinbefore, the invention has been made taking into account the operating speed limitations of LSI and VLSI devices. An optical integrated circuit is thereby provided including at least one semiconductor laser as a main device, in which the electrical input is limited to supplying power and all active signals take the form of light. As is well known, in order to provide a considerable number of logic functions or the like on a single chip and to make the operations high speed, the number of semiconductor lasers integrated in one chip should be at least several hundred, preferably five hundred or more, and more preferably, a thousand or more.

Considering heat, radiation and temperature increases due to power consumption of one chip, the maximum electric power consumption per chip should be one watt at most. Therefore, if 500 lasers are integrated on one chip, the power consumption per one laser may be 2 mW, and for 1,000 lasers it becomes 1 mW. That is, the greater the number of lasers on one chip, the smaller the power consumption allowed for each laser. It has been described with reference to FIG. 4 that the power consumption of a semiconductor laser can be lowered by a shortened resonator, narrowed stripe and increased mirror surface reflection coefficient. In order to realize a power consumption of 1 mW per laser, the reflection coefficient R at both mirror surfaces should be larger than 0.4. For values of R of 0.5, 0.7, 0.9 and 1.0, the length of the resonator should be less than about 30 $\mu$m, 80 $\mu$m, 110 $\mu$m and 130 $\mu$m in the case of stripe width 130 $\mu$m, respectively. Therefore the product of the stripe width and the resonator length should be less than 130 $\mu m^2$. By another expression, this product should be less than approximately $$130 \times (Eg_B/Eg_A) \mu m^2,$$

If the power consumption is 0.2 mW, then $R = 0.9$, and the resonator should be no longer than 10 $\mu$m.

FIG. 4 shows that the higher reflection coefficient at the end faces of the resonator causes a lowering of the power consumption effectively. When a high density optical integrated circuit is desired it is fundamental to provide an insulating layer on a smaller surface of a semiconductor laser and to form a metal film on the insulating layer to thereby increase the reflection coefficient thereof. Also, the thickness of the insulating layer should be half of the effective wavelength because the electric field intensity of light at the end faces of the semiconductor laser can be very small. Since the electric field intensity at the interface between the insulating layer and the metal film can also be very small, the electric field intensity in all of the portions around the interface is very small, resulting in freedom from malfunctions and a high reliability.

The present invention has been described with regard to various semiconductor laser structures, each being effective in reducing the power consumption per laser. The present invention has also been described with reference to structures for producing optical pulses of very high repetition rate, e.g., several picoseconds. The invention may also be applied to light-to-light control logic circuits and a light-to-light control memory. That is, the present invention may be applied in future optical digital LSI.

In order to achieve certain functions, it may be desired to have some portions of an LSI device having a power consumption per gate above 1 mW. However, this is basically impossible to achieve in an optical LSI device unless the power consumption per laser should be 1 mW or less, as mentioned previously.

An optical IC according to the present invention can be formed of semiconductor lasers, the power consumption of each is equal to or less than about 1 mW. Light-to-light logic operations, as well as memory operations, can be performed at very high speeds in so doing.

These embodiments of this invention are applied not only to GaAs-GaAlAs hetero systems, but also to other heterosystems, that is, InP-InGaPAs, AlSb-GaInSb, GaAs-GaInP, GaSb-InAsSb, GaAs-AlGaInP, PbTe-PSnTe, PbS-PbSSe and so on. The design conditions of this invention for the GaAs-Ga AlAs system generally are applied to other materials by the physical constants, that is refractive index n, lasing wavelength $\lambda$, energy gap $E_g$ and so on.

What is claimed is:

1. A semiconductor laser having at least
   a first layer, being a cladding layer, formed on a substrate,
   a second (active) layer, being an active layer, formed on said first layer,
   a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1 R_2}$ of end faces of said resonator is larger than 0.4 to restrict power dissipation of said semiconductor laser to about 1 mW or less,
   first electrode means electrically contacting said first layer,
   second electrode means electrically contacting said third layer, and
   wherein $Eg_B$ is a bandgap of GaAs, $Eg_A$ is a bandgap of the principle material of said active layer, and $R_1$ and $R_2$ are power reflectivities of said end faces.

2. The semiconductor laser of claim 1, wherein mirror means is disposed on at least one of said end faces of said resonator, said mirror means comprising of an insulating film covered by a layer of metal.

3. The semiconductor laser of claim 2, wherein a thickness t of said insulating film is approximately $t = (\gamma/2) \cdot (\lambda/n)$, where $\gamma$ is an integer, $\lambda$ is a free-space wavelength of light, and n is a refractive index of said insulating film.

4. The semiconductor laser of claim 3, wherein said insulating film is formed of a material selected from the group consisting of AlN, $SiO_2$, $SiN_4$, GaN, BN and $Al_2O_3$.

5. The semiconductor laser of claim 4, wherein said metal is formed of a material selected from the group consisting of Au, Al, Mo and W.

6. The semiconductor laser of any one of claims 2, 3, 4 and 5 wherein;
   said substrate and first layer have a first conductivity type,
   a fourth layer of a second conductivity type, opposite to said first conductivity type, is formed between said substrate and said first layer and has a greater refractive index than said cladding layers;
   said first layer has an elongated thickened portion extending through said fourth layer to said substrate;
   said third layer has said second conductivity type;
   a highly doped cathode region of said second conductivity type is formed in said third region and is electrically conencted to said second electrode means;
   a gate region of said first conductivity type is formed in said third layer, said gate region surrounding said cathode region;
   said substrate comprising a highly doped region having said first conductivity type serves as an anode electrically connected to said first electrode means.

7. The semiconductor laser of claim 6 wherein;
   a fifth layer with a band gap smaller than that of said cladding layers is formed on said third layer to decrease the contact resistance of the electrodes;
   said gate region extends to said third layer through said fifth layer;
   said cathode region extends to said third layer through said fifth layer or is formed only at said fifth layer, said gate region depth is deeper than that of said cathode region.

8. The semiconductor laser of claim 6, wherein;
   said substrate is formed of $n^+$ or $p^+$ GaAs and has an impurity concentration higher than $1 \times 10^{18}$ cm$^{-3}$;
   said first layer is formed of $n^+$ or $p^+$ GaAlAs and has an impurity concentration higher than $5 \times 10^{17}$ cm$^{-3}$ and a thickness in a range of 0.05 to 0.5 $\mu m$, except for said thickened portion which has a thickness in a range of 1 to 5 $\mu m$;
   said second layer is formed of GaAs or GaAlAs and has a thickness in a range of 0.05 to 0.5 $\mu m$ has a band gap smaller than that of said cladding layer;
   said third layer is formed of p or n GaAlAs and has an impurity concentration in a range of $1 \times 10^{10}$ to $1 \times 10^{16}$ cm$^{-3}$ and a thickness in a range of 0.5 to 3 $\mu m$;
   said fourth layer is formed of $p^+$ or $n^+$ GaAs or GaAlAs and has an impurity concentration higher than $1 \times 10^{17}$ cm$^{-3}$ and a thickness in a range of 0.5 to 5 $\mu m$ and a refractive index larger than that of said cladding layer;

said gate region is formed of n+ or p+ region and has an impurity concentration higher than $1 \times 10^{18}$ cm$^{-3}$; and said cathode region is formed of p+ or n+ region and has an impurity concentration higher than $1 \times 10^{18}$ cm$^{-3}$.

9. The semiconductor laser of claim 8, wherein a distance between paired gates is in a range of 0.3 to 3 μm.

10. The semiconductor laser of any one of claims 1, 2, 3, 4 and 5 wherein;
- a fifth layer of a first conductivity type is buried in said substrate along said resonator and a part of said fifth layer extends to a surface of said semiconductor laser;
- a fourth layer of a second conductivity type, opposite to said first conductivity type, is formed between said substrate and said first layer and has a greater refractive index than said cladding layer;
- said first layer has said first conductivity type and an elongated thickened portion extending thorugh said fourth layer to said fifth layer;
- a highly doped cathode region of said second conductivity type is formed adjacent to said third layer and is electrically connected to said second electrode means;
- said third layer has said second conductivity type,
- said gate region of said first conductivity type is formed in said third layer, said gate region surrounding said cathode region and said gate region depth is deeper than that of said cathode region; and
- said fifth layer serves as an anode electrically connected to said first electrode means, and said substrate is semi-insulating or of said second conductivity type.

11. The semiconductor laser of claim 10, wherein;
- a sixth layer of a band gap smaller than that of said cladding layer is formed on said third layer;
- said gate region extends through said sixth layer to said third layer;
- said cathode region extends to said third layer through said sixth layer or is formed only at said sixth layer.

12. The semiconductor laser of any one of claims 1, 2, 3, 4 and 5, wherein;
- said substrate, said first layer, said second layer and said third layer are of a first conductivity type;
- an elongated region of a second conductivity type opposite to said first conductivity type extends through said second and third layers into said first layer or extends through said third layer into said second layer.

13. The semiconductor laser of claim 12, wherein said structure comprises a fourth layer of a second conductivity type, opposite to said first conductivity type, being formed between said substrate and said first layer; said first layer extending through said fourth layer to said substrate.

14. The semiconductor laser of claim 13, wherein said first layer comprises a thickened portion lying beneath said elongated region;
said fourth layer has the larger refractive index than said first layer.

15. The semiconductor laser of any one of claims 13 and 14, wherein said first conductivity type is n and said second conductivity type is p.

16. The semiconductor laser of claim 12, wherein a width of said elongated region is less than twice a diffusion length of an electron in said elongated region.

17. The semiconductor laser of claim 14, wherein a width of said elongated region is less than twice a diffusion length of an electron in said elongated region.

18. The semiconductor laser of claim 12, further comprising an insulating layer formed on said third layer.

19. The semiconductor laser of claim 14, further comprising an insulating layer formed on said third layer.

20. The semiconductor laser of any one of claims 1, 2, 3, 4 and 5, wherein said structure comprises;
- said substrate, said first layer and said second layer of said first conductivity type;
- said third layer of said first conductivity type having V-shaped groove;
- an elongated region of a second conductivity type opposite to said first conductivity type being at least formed at said V-shaped region and extending through said second and third layer into said first layer or extending through said third layer into said second layer.

21. The semiconductor laser of claim 20, wherein said structure comprises;
- a fourth layer of said second conductivity type being formed between said substrate and said first layer;
- said first layer extending through said fourth layer to said substrate.

22. The semiconductor laser of claim 20, wherein said first layer comprises a thickened portion beneath said V-shaped region.

23. The semiconductor laser of claim 21, wherein said first layer comprises a thickened portion beneath said V-shaped region.

24. The semiconductor laser of claim 20, wherein a width of said V-shaped portion in contact with said second layer is less than 1 μm.

25. The semiconductor laser of claim 20, wherein said structure comprises;
- said substrate of high resistivity,
- a fifth layer being buried in said substrate and extending to a surface of said semiconductor laser;
- said first layer contacting to said fifth layer.

26. The semiconductor laser of claim 21, wherein said structure comprises:
- said substrate of high resistivity;
- a fifth layer being buried in said substrate and extending to a surface of said semiconductor laser;
- said first layer contacting to said fifth layer.

27. The semiconductor laser of any one of claims 1, 2, 3, 4 and 5, wherein said structure comprises:
- said substrate, first layer, second layer and third layer of a high resistivity;
- a fourth layer of a first conductivity type extending through said second and third layers into said first layer; and
- an elongated fifth layer of a second conductivity type, opposite to said first conductivity type, extending through a portion of said fourth layer and said second layer.

28. The semiconductor laser of claim 27, wherein said first conductivity type is n type and said second conductivity type is p type.

29. The semiconductor laser of claim 28, wherein said substrate and said first, second and third layers are n-type layers.

30. The semiconductor laser of any one of claims 1, 2, 3, 4 and 5, wherein said structure comprises:

said substrate and said first, second and third layers being a first conductivity type;

a fourth layer of said first conductivity type being formed between said first layer and second layer;

a fifth layer of said first conductivity type being formed between said second layer and third layer;

said fourth and fifth layers having a refractive index which decreases gradually from said active layer to said cladding layer;

an elongated region of a second conductivity type, opposite to said first conductivity type, extending through said third, fifth and second layer into a portion of said fourth layer.

31. The semiconductor laser of claim 30, wherein; a refractive index distribution n(x) in said layers varies as $n_0(1-ax^2)$, where $n_0$ and a are constants and x is a distance from a center of said active layer in direction perpendicular to a junction plane.

32. The semiconductor laser of any one of claims 1, 2, 3, 4 and 5 wherein said structure comprises:

said substrate and said first and third layers of a first conductivity type;

said second layer of a second conductivity type opposite to said first conductivity type;

a fourth layer of said second conductivity being formed between said first and second layers and having a wider band gap than that of said second layer; and an elongated fifth layer of said second conductivity type extending through said third layer into said second layer.

33. The semiconductor laser of claim 32 further comprising a high resistivity region formed outwardly of said fifth layer.

34. The semiconductor laser of claim 33, wherein a thickness of said fourth layer is approximately thicker than 100 Å.

35. A semiconductor laser having at least a first layer, being a cladding layer, formed on a substrate, a second layer, being an active layer, formed on said first layer, a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1R_2}$ of end faces of said resonator is larger than 0.4 to restrict power dissipation of said semiconductor laser to about 1 mW or less, first electrode means electrically contacting said first layer, second electrode means electrically contacting said third layer, and wherein:

$Eg_B$ is a bandgap of GaAs, $Eg_A$ is a bandgap of the principle material of said active layer, and $R_1$ and $R_2$ are power reflectivities of said end faces, said substrate, said first layer, said second layer and said third layer are of a first conductivity type, and an elongated region of a second conductivity type opposite to said first conductivity type extends through said second and third layers into said first layer or extends through said third layer into said second layer, said first layer comprises a thickened portion lying beneath said elongated region, and said fourth layer has the larger refractive index than said first layer.

36. A semiconductor laser having at least a first layer, being a cladding layer, formed on a substrate, a second layer, being an active layer, formed on said first layer, a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1R_2}$ of end faces of said resonator is larger than 0.4 to restrict power dissipation of said semiconductor laser to about 1 mW or less, first electrode means electrically contacting said first layer, second electrode means electrically contacting said third layer, and wherein;

$Eg_B$ is a bandgap of GaAs, $Eg_A$ is a bandgap of the principle material of said active layer, and $R_1$ and $R_2$ are power reflectivities of said end faces, said substrate, said first layer, said second layer and said third layer are of a first conductivity type, an elongated region of a second conductivity type opposite to said first conductivity type extends through said second and third layers into said first layer or extends through said third layer into said second layer, and said first conductivity type is n and said second conductivity type is p.

37. A semiconductor laser having at least a first layer, being a cladding layer, formed on a substrate, a second layer, being an active layer, formed on said first layer, a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1R_2}$ of end faces of said resonator is larger than 0.4 to restrict power dissipation of said semiconductor laser to about 1 mW or less, first electrode means electrically contacting said first layer, second electrode means electrically contacting said third layer, and wherein;

$Eg_B$ is a bandgap of GaAs, $Eg_A$ is a bandgap of the principle material of said active layer, and $R_1$ and $R_2$ are power reflectivities of said end faces, said substrate, said first layer, said second layer and said third layer are of a first conductivity type, an elongated region of a second conductivity type opposite to said first conductivity type extends through said second and third layers into said first layer or extends through said third layer into said second layer, and wherein said structure further comprises:

a fourth layer of a second conductivity type, opposite to said first conductivity type, being formed between said substrate and said first layer;

said first layer extending through said fourth layer to said substrate, and wherein a width of said elongated region is less than twice a diffusion length of an electron in said elongated region.

38. A semiconductor laser having at least
a first layer, being a cladding layer, formed on a substrate,
a second layer, being an active layer, formed on said first layer,
a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1 R_2}$ of end faces of said resonator is larger than 0.4 to restrict power dissipation of said semiconductor laser to about 1 mW or less,
first electrode means electrically contacting said first layer,
second electrode means electrically contacting said third layer, and wherein:
$Eg_B$ is a bandgap of GaAs, $Eg_A$ is a bandgap of the principle material of said active layer, and $R_1$ and $R_2$ are power reflectivities of said end faces, and
said substrate, said first layer, said second layer and said third layer are of a first conductivity type; and
an elongated region of a second conductivity type opposite to said first conductivity type extends through said second and third layers into said first layer or extends through said third layer into said second layer, and
wherein said structure further comprises:
a fourth layer of a second conductivity type, opposite to said first conductivity type, being formed between said substrate and said first layer;
said first layer extending through said fourth layer to said substrate; and
said the semiconductor laser further comprising an insulating layer formed on said third layer.

39. A semiconductor laser having at least
a first layer, being a cladding layer, formed on a substrate,
a second layer, being an active layer, formed on said first layer,
a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1 R_2}$ of end faces of said resonator is larger than 0.4 to restrict power dissipation of said semiconductor laser to about 1 mW or less,
first electrode means electrically contacting said first layer,
second electrode means electrically contacting said third layer, and
wherein $Eg_B$ is a bandgap of GaAs, $Eg_A$ is a bandgap of the principle material of said active layer, and $R_1$ and $R_2$ are power reflectivities of said end faces, and
wherein said structure comprises;
said substrate, said first layer and said second layer of said first conductivity type;
said third layer of said first conductivity type having V-shaped groove;
an elongated region of a second conductivity type opposite to said first conductivity type being at least formed at said V-shaped region and extending through said second and third layer into said first layer or extending through said third layer into said second layer, and
wherein a width of said V-shaped poriton in contact with said second layer is less than 1 $\mu m$.

40. A semiconductor laser having at least
a first layer, being a cladding layer, formed on a substrate,
a second layer, being an active layer, formed on said first layer,
a third layer, being a cladding layer, formed on said second layer, wherein said cladding layers have a refractive index smaller than that of said active layer, and a product of a strip width and a length of a resonator is less than 130 $(Eg_B/Eg_A)\mu m^2$ and an effective reflectivity of $\sqrt{R_1 R_2}$ of end faces of said resonator is larger than 0.4 to restrict power dissipation of said semiconductor laser to about 1 mW or less,
first electrode means electrically contacting said first layer,
second electrode means electrically contacting said third layer, and
wherein $Eg_B$ is a bandgap of GaAs, $Eg_A$ is a bandgap of the principle material of said active layer, and $R_1$ and $R_2$ are power reflectivities of said end faces, and
wherein said structure comprises;
a fourth layer of said second conductivity type being formed between said substrate and first layer;
said first layer extending through said fourth layer to said substrate, and
wherein a width of said V-shaped poriton in contact with said second layer is less than 1 $\mu m$.

* * * * *